United States Patent
Henry

(10) Patent No.: US 11,887,222 B2
(45) Date of Patent: Jan. 30, 2024

(54) CONVERSION OF FILLED AREAS TO RUN LENGTH ENCODED VECTORS

(71) Applicant: Rockwell Collins, Inc., Cedar Rapids, IA (US)

(72) Inventor: Jeff M. Henry, Cedar Rapids, IA (US)

(73) Assignee: Rockwell Collins, Inc., Cedar Rapids, IA (US)

(*) Notice: Subject to any disclaimer, the term of this patent is extended or adjusted under 35 U.S.C. 154(b) by 51 days.

(21) Appl. No.: 17/525,431

(22) Filed: Nov. 12, 2021

(65) Prior Publication Data

US 2023/0154071 A1    May 18, 2023

Related U.S. Application Data

(60) Provisional application No. 63/278,576, filed on Nov. 12, 2021.

(51) Int. Cl.
    *G06T 11/20* (2006.01)
    *G06T 1/60* (2006.01)
    *G06T 9/20* (2006.01)

(52) U.S. Cl.
    CPC ............. *G06T 11/203* (2013.01); *G06T 1/60* (2013.01); *G06T 9/20* (2013.01); *G06T 2210/22* (2013.01)

(58) Field of Classification Search
    None
    See application file for complete search history.

(56) References Cited

U.S. PATENT DOCUMENTS

| | | |
|---|---|---|
| 3,522,586 A | 8/1970 | Kiji et al. |
| 3,656,178 A | 4/1972 | Maine et al. |
| 4,096,527 A | 6/1978 | Furuta |
| 4,736,303 A | 4/1988 | Itoh et al. |

(Continued)

FOREIGN PATENT DOCUMENTS

| | | |
|---|---|---|
| CA | 3095088 C | 2/2021 |
| CN | H05205069 A  * | 8/1993 |

(Continued)

OTHER PUBLICATIONS

Seo et al, 'Fast Contour-Tracing Algorithm Based on a Pixel-Following Method for Image Sensors', Sensors, MDPI. (Year: 2016).*

(Continued)

*Primary Examiner* — Patrick F Valdez
(74) *Attorney, Agent, or Firm* — Suiter Swantz pc llo

(57) ABSTRACT

A method and system for converting a filled shape to a run length encoded RLE vector is disclosed. The method includes creating a virtual pixel array of pixel cells corresponding to a graphical array of pixels comprising the filled shape. The method includes determining a border on the virtual pixel array corresponding to the filled shape, storing a pixel-type value within each pixel cell that corresponds to a border line element within the pixel, and creating a shape RLE group corresponding to a line of pixels aligned along a first axis of the virtual pixel array. Once created, the position and length of the shape RLE group is stored as an RLE vector. The method for clipping filled shapes is also disclosed, which includes converting a clipping region to a clip RLE group, then comparing the clip RLE group to the shape RLE group, forming a clipped image RLE vector.

13 Claims, 17 Drawing Sheets

(56) References Cited

U.S. PATENT DOCUMENTS

| | | | |
|---|---|---|---|
| 4,792,981 A | 12/1988 | Cahill, III et al. | |
| 4,876,651 A | 10/1989 | Dawson et al. | |
| 5,050,230 A | 9/1991 | Jones et al. | |
| 5,428,692 A | 6/1995 | Kuehl | |
| 5,454,076 A | 9/1995 | Cain et al. | |
| 5,499,382 A | 3/1996 | Nusinov et al. | |
| 5,537,669 A | 7/1996 | Evans et al. | |
| 5,546,572 A | 8/1996 | Seto et al. | |
| 5,559,707 A | 9/1996 | DeLorme et al. | |
| 5,577,170 A | 11/1996 | Karow | |
| 5,936,637 A | 8/1999 | Seto | |
| 5,978,715 A | 11/1999 | Briffe et al. | |
| 6,014,133 A | 1/2000 | Yamakado et al. | |
| 6,240,341 B1 | 5/2001 | Snyder | |
| 6,275,610 B1 | 8/2001 | Hall, Jr. et al. | |
| 6,320,984 B1* | 11/2001 | Shigeta | G06V 30/184 382/199 |
| 6,448,922 B1* | 9/2002 | Kelly | G01S 13/951 342/52 |
| 6,501,441 B1 | 12/2002 | Ludtke et al. | |
| 6,839,714 B2 | 1/2005 | Wheeler et al. | |
| 7,039,505 B1* | 5/2006 | Southard | H04N 19/186 701/3 |
| 7,096,211 B2 | 8/2006 | Fujihara | |
| 7,173,738 B2 | 2/2007 | Kohn | |
| 7,552,010 B2 | 6/2009 | Saito | |
| 7,552,011 B2 | 6/2009 | Ishii et al. | |
| 7,562,289 B2 | 7/2009 | Bufkin et al. | |
| 7,581,036 B2 | 8/2009 | Powell et al. | |
| 7,609,263 B2 | 10/2009 | Nagasaki et al. | |
| 7,739,622 B2 | 6/2010 | DeLine et al. | |
| 7,777,749 B2 | 8/2010 | Chung et al. | |
| 7,948,502 B2 | 5/2011 | Stanton | |
| 7,966,609 B2 | 6/2011 | Serebryany | |
| 8,035,642 B2 | 10/2011 | Suzuki | |
| 8,165,732 B2 | 4/2012 | Corbefin et al. | |
| 8,169,505 B2 | 5/2012 | Hoshi | |
| 8,306,745 B1 | 11/2012 | Clark et al. | |
| 8,339,417 B2 | 12/2012 | Stroila et al. | |
| 8,374,390 B2 | 2/2013 | Stroila et al. | |
| 8,379,065 B2 | 2/2013 | Nam et al. | |
| 8,515,658 B1 | 8/2013 | Foster et al. | |
| 8,583,368 B1 | 11/2013 | Sindlinger et al. | |
| 8,704,732 B2 | 4/2014 | Pourbigharaz et al. | |
| 8,937,737 B2 | 1/2015 | Tsutsumi et al. | |
| 9,035,969 B2 | 5/2015 | Ivashin et al. | |
| 9,195,637 B2 | 11/2015 | Peraza et al. | |
| 9,430,195 B1 | 8/2016 | Pecoraro et al. | |
| 9,443,433 B1 | 9/2016 | Conway et al. | |
| 9,465,513 B2 | 10/2016 | Sims | |
| 9,489,121 B2 | 11/2016 | Davis et al. | |
| 9,547,727 B2 | 1/2017 | Passani et al. | |
| 9,619,919 B1 | 4/2017 | Postnikov et al. | |
| 9,639,309 B1 | 5/2017 | Pugh | |
| 9,671,935 B2 | 6/2017 | Miichi et al. | |
| 9,703,455 B2 | 7/2017 | Cocco et al. | |
| 9,781,294 B1 | 10/2017 | Chapman | |
| 9,818,051 B2 | 11/2017 | Panek et al. | |
| 9,858,823 B1 | 1/2018 | Lynn et al. | |
| 9,891,875 B2 | 2/2018 | Kim et al. | |
| 9,921,721 B2 | 3/2018 | Beavers et al. | |
| 9,939,271 B1 | 4/2018 | Foster et al. | |
| 10,001,376 B1 | 6/2018 | Tiana et al. | |
| 10,061,480 B1 | 8/2018 | McCusker et al. | |
| 10,170,010 B1 | 1/2019 | McCusker et al. | |
| 10,372,292 B2 | 8/2019 | Vogel et al. | |
| 10,674,075 B2 | 6/2020 | Kimura | |
| 10,684,769 B2 | 6/2020 | Yamat et al. | |
| 10,872,274 B2 | 12/2020 | Mao et al. | |
| 10,880,522 B2 | 12/2020 | McCutchen et al. | |
| 10,984,501 B2 | 4/2021 | Milan et al. | |
| 11,030,477 B2 | 6/2021 | Becker et al. | |
| 11,061,563 B1 | 7/2021 | Nielsen et al. | |
| 11,106,329 B2 | 8/2021 | He et al. | |
| 2003/0151630 A1 | 8/2003 | Kellman et al. | |
| 2004/0071351 A1 | 4/2004 | Rade | |
| 2004/0225440 A1 | 11/2004 | Khatwa et al. | |
| 2005/0030321 A1* | 2/2005 | Anwar | G06F 3/1284 345/629 |
| 2005/0091340 A1 | 4/2005 | Facemire et al. | |
| 2006/0031006 A1 | 2/2006 | Stenbock et al. | |
| 2006/0215915 A1 | 9/2006 | Kim | |
| 2007/0067095 A1 | 3/2007 | King | |
| 2007/0094591 A1 | 4/2007 | Etgen et al. | |
| 2007/0112517 A1 | 5/2007 | Goldstein | |
| 2007/0185651 A1 | 8/2007 | Motoyama et al. | |
| 2008/0046254 A1 | 2/2008 | Nuno et al. | |
| 2008/0103641 A1 | 5/2008 | Ratcliffe | |
| 2008/0240152 A1 | 10/2008 | Quinn et al. | |
| 2009/0080801 A1* | 3/2009 | Hatfield | G06T 11/60 382/283 |
| 2009/0123070 A1 | 5/2009 | Xiaoying | |
| 2009/0125837 A1 | 5/2009 | Hatem et al. | |
| 2009/0324065 A1 | 12/2009 | Ishida et al. | |
| 2010/0128020 A1 | 5/2010 | Oh et al. | |
| 2010/0218089 A1 | 8/2010 | Chao et al. | |
| 2010/0262318 A1 | 10/2010 | Ariens | |
| 2010/0328353 A1 | 12/2010 | McDonald et al. | |
| 2011/0191014 A1 | 8/2011 | Feng et al. | |
| 2012/0019673 A1 | 1/2012 | Narayanan | |
| 2012/0242687 A1 | 9/2012 | Choi | |
| 2012/0287151 A1 | 11/2012 | James et al. | |
| 2014/0168277 A1 | 6/2014 | Ashley et al. | |
| 2014/0225928 A1 | 8/2014 | Konnola et al. | |
| 2014/0282038 A1 | 9/2014 | Royster et al. | |
| 2015/0070373 A1 | 3/2015 | Clinton | |
| 2015/0239574 A1 | 8/2015 | Ball et al. | |
| 2015/0278626 A1 | 10/2015 | Nakamura | |
| 2015/0324088 A1 | 11/2015 | Pasetto et al. | |
| 2016/0092557 A1 | 3/2016 | Stojanovic et al. | |
| 2017/0262413 A1 | 9/2017 | Song et al. | |
| 2017/0299633 A1 | 10/2017 | Pietrowicz et al. | |
| 2017/0313332 A1 | 11/2017 | Paget et al. | |
| 2018/0181646 A1 | 6/2018 | Balasa et al. | |
| 2018/0253889 A1* | 9/2018 | Nagasaka | G06T 11/40 |
| 2019/0057671 A1 | 2/2019 | Baer et al. | |
| 2019/0220234 A1 | 7/2019 | Lewis et al. | |
| 2019/0237043 A1 | 8/2019 | Tahmasebi | |
| 2019/0299701 A1 | 10/2019 | Bartels | |
| 2020/0089694 A1 | 3/2020 | Cabra et al. | |
| 2020/0195924 A1 | 6/2020 | Hsiang | |
| 2020/0251029 A1 | 8/2020 | Tseng | |
| 2020/0255350 A1 | 8/2020 | Baek | |
| 2020/0320142 A1 | 10/2020 | Malak et al. | |
| 2020/0386567 A1 | 12/2020 | Igarashi | |
| 2021/0004930 A1 | 1/2021 | Kamath et al. | |
| 2021/0035453 A1 | 2/2021 | Khan et al. | |
| 2021/0056300 A1 | 2/2021 | Chitta et al. | |
| 2021/0192202 A1 | 6/2021 | Tripuraneni et al. | |
| 2021/0225181 A1 | 7/2021 | Feyereisen et al. | |
| 2021/0349615 A1 | 11/2021 | Ruby et al. | |
| 2023/0154338 A1 | 5/2023 | Henry et al. | |

FOREIGN PATENT DOCUMENTS

| | | | |
|---|---|---|---|
| CN | 1045835 C | | 10/1999 |
| CN | 100440222 C | | 12/2008 |
| CN | 101751449 A | * | 6/2010 |
| CN | 101676988 B | | 12/2011 |
| CN | 102714759 B | | 10/2016 |
| CN | 107026958 A | | 8/2017 |
| CN | 107402734 A | | 11/2017 |
| CN | 109325083 A | | 2/2019 |
| CN | 110727747 A | | 1/2020 |
| CN | 110906938 A | | 3/2020 |
| EP | 0341645 A2 | | 11/1989 |
| EP | 0380294 A1 | | 8/1990 |
| EP | 0748562 A1 | | 10/1998 |
| EP | 1352315 A2 | | 10/2003 |
| EP | 1366462 A2 | | 12/2003 |
| EP | 1454213 A2 | | 9/2004 |
| EP | 1272977 B1 | | 12/2004 |
| EP | 1687777 A2 | | 8/2006 |
| EP | 2224359 A2 | | 9/2010 |

(56) References Cited

FOREIGN PATENT DOCUMENTS

| | | | |
|---|---|---|---|
| EP | 2792998 A2 | 10/2014 | |
| EP | 2879061 A2 | 6/2015 | |
| EP | 1736894 A4 | 7/2016 | |
| EP | 3201879 A1 | 8/2017 | |
| EP | 3538978 A4 | 8/2020 | |
| EP | 3845862 A1 | 7/2021 | |
| GB | 2504085 A | 1/2014 | |
| JP | S622721 A | 1/1987 | |
| JP | S62196772 A | 8/1987 | |
| JP | S6393273 A | 4/1988 | |
| JP | 3871040 B2 | 1/2007 | |
| JP | 2007133231 A | 5/2007 | |
| JP | 2008022215 A | 1/2008 | |
| JP | 2009282855 A | 12/2009 | |
| JP | 4728744 B2 | 7/2011 | |
| WO | WO-9523364 A2 * | 8/1995 | ........... B23Q 35/128 |
| WO | 1998043208 A3 | 1/1999 | |
| WO | 2011036499 A1 | 3/2011 | |
| WO | 2014146561 A1 | 9/2014 | |
| WO | 2021035223 A1 | 2/2021 | |
| WO | 2021035954 A1 | 3/2021 | |

OTHER PUBLICATIONS

ArcGIS, "Introduction to export a map or layout", retrieved from the Internet Nov. 11, 2021.

Bongwon Suh, Haibin Ling, Benjamin B. Bederson, and David W. Jacobs. 2003. Automatic thumbnail cropping and its effectiveness. In Proceedings of the 16th annual ACM symposium on User interface software and technology (UIST 03). Association for Computing Machinery, New York, NY, USA, 95-104.

Houston, Ben & Nielsen, Michael & Batty, Christopher & Nilsson, Ola & Museth, Ken. (2006). Hierarchical RLE Level Set: A compact and versatile deformable surface representation. ACM Trans. Graph . . . 25. 151-175.

Jeppesen, "JeppView for Windows, User Guide", (2016), 92 pages.

Lufthanasa Systems Blog, "Lido eRouteManual 4.3 Design Overview", (2016) Retrieved from the Internet.

Maptiler, "Software performs Geocoding, Place name search, and Reverse Geocoding." Retrieved from Internet on Nov. 11, 2021.

Microsoft, "Generate a thumbnail sprite with Azure Media Services", (2021), Retrieved from Internet Nov. 11, 2021.

Narkive Mailinglist Archive, "Fastest Method of Drawing a TileMap", (2002), Retrieved from Internet Nov. 11, 2021.

Navigraph, "Navigraph Charts", Retrieved from the Internet.

Pamental, Jason, "Digging in to dynamic typography", Retrieved from Internet , Nov. 11, 2021, 11 pages.

Pamental, Jason, "The evolution of typography with variable fonts", Retrieved from the Internet , Nov. 11, 2021.

Penquerch, "[AD] RLE clipping speedup patch" (2002), Retrieved from Internet , Nov. 11, 2021.

QGIS: Open-source cross-platform GIS software, Retrieved from Internet , Nov. 11, 2021.

Somasundaram, K. "A Method for Filling Holes in Objects of Medical Images Using Region Labeling and Run Length Encoding Schemes." (2010).

Anonymous: "Pilot's Guide to ForeFlight Mobile 82nd Edition Covers ForeFlight Mobile v12.7", Aug. 26, 2020, pp. 161-165.

Anonymous: Pilot's Guide to ForeFlight Mobile 82nd Edition Covers ForeFlight Mobile v12.7, Aug. 26, 2020, pp. 78-90.

Extended European Search Report dated Apr. 5, 2023, European Application No. 22207025.2.

Extended European Search Report dated Apr. 5, 2023, European Application No. 22207047.6.

Extended European Search Report dated Apr. 5, 2023; European Application No. 22207057.5.

Anonymous: "SkyDemon Mobile, GBS handheld navigation devices for aircrfaft", Dec. 4, 2021; Internet URL https://web.archive.org/web/20211204140934/https://www.skydemon.aero/inflight/.

C. Pschierer et al, "Human factors analysis for a 2D enroute moving map application", SPIE, PO Box 10, Bellingham, WA 98227-0010 USA, vol. 5802, May 25, 2005.

Extended European Search Report dated Apr. 11, 2023; European Application No. 22207123.5.

Extended European Search Report dated Apr. 12, 2023; European Application No. 22207050.0.

Extended European Search Report dated Apr. 12, 2023; European Application No. 22207124.3.

Extended European Search Report dated Apr. 18, 2023; European Application No. 22207164.9.

Rockwell Collins: "Flight Database Services for Pro Line Fusion", Jan. 12, 2021, XP093035870, Internet URL: https://www.rockwellcollins.com/-/media/files/unsecure/products/product-brochures/navigation-and-guidance/flight-management-systems/resources/fusion-data-base-services-01.pdf?la=en&lastupdate=20210125195039&csrt=15271691716207860418, p. 5.

Skysectionals: "Tour Low-Altitude Enroute Charts", Sep. 22, 2021; XP093035866, Internet: URL:https://web.archive.org/web/20210922184910/https://skysectionals.com/tour-enroute/.

Stephen Dubet; Institute of Electrical and Electronics Engineers: "Aeronautical charts for electronic flight bags", 22nd. DASC. The 22nd Digital Avionics Systems Conference Proceedings. Indianapolis, IN Oct. 12-16, 2003. vol. 2, pp. 13_D_1_1_13_D_1_9, XP010669024.

Extended European Search Report dated Apr. 11, 2023; European Application No. 22207049.2.

Extended European Search Report dated Apr. 4, 2023; European Application No. 22207012.0.

Extended European Search Report dated Apr. 5, 2023; European Application No. 22207019.5.

Hatlapatka Radim: "JBIG2 Supported by OCR", EUDML Jul. 9, 2012, pp. 1-9.

Shang Junqing et al: "JBIG2 text image compression based on OCR", Proceedings of the SPIE, vol. 6067, Jan. 15, 2006, p. 6067D.

Extended European Search Report dated Mar. 24, 2023; European Application No. 22207029.4.

Anonymous: "algorithm-Contour of a run-length-coded digital shape", Stack Overflow, Dec. 31, 2015, pp. 1-5, URL:https://stackoverflow.com/questions/32354807/contour-of-a-run-length-coded-digital-shape.

Extended European Search Report dated Apr. 21, 2023; European Application No. 22207060.9.

Extended European Search Report dated Jun. 13, 2023; European Application No. 22206954.4.

Neupane Prasanga et al: "Extracting Unknown Repeated Pattern in Tiled Images: 19th International Conference on Hybrid Intelligent Systems (HIS 2019) held in Bhopal, India, Dec. 10-12, 2019" In: Intelligent Autonomous Systems 13, International Publishing, Cham, vol. 1179, pp. 92-102.

Yang Y. et al: "Vectorization of Linear Features in Scanned Topographic Maps Using Adaptive Image Segmentation and Sequential Line Tracking", The International Archives of the Photogrammetry, Remote Sensing and Spatial Information Sciences, vol. XXXIX-B4, Aug. 25, 2012, pp. 103-108.

* cited by examiner

CONVERSION OF FILLED AREAS TO RUN LENGTH ENCODED VECTORS

CROSS-REFERENCE TO RELATED APPLICATIONS

The present application is related to and claims the benefit of the earliest available effective filing dates from the following listed applications (the "Related Applications") (e.g., claims earliest available priority dates for other than provisional patent applications (e.g., under 35 USC § 120 as a continuation in part) or claims benefits under 35 USC § 119(e) for provisional patent applications, for any and all parent, grandparent, great-grandparent, etc. applications of the Related Applications).

RELATED APPLICATIONS

U.S. Provisional Patent Application Ser. No. 63/278,576 entitled SYSTEMS AND METHODS FOR GENERATION, SELECTION, AND DISPLAY OF MAP-BASED CHART DATABASES FOR USE WITH CERTIFIED AVIONICS SYSTEMS and filed Nov. 12, 2021;

Concurrently filed U.S. patent application Ser. No. 17/525,659, entitled TOOL TO FACILITATE CUSTOMER GENERATED CHART DATABASES FOR USE WITH A CERTIFIED AVIONICS SYSTEM;

Concurrently filed U.S. patent application Ser. No. 17/525,690, entitled ELECTRONIC CHART APPLICATION WITH ENHANCED ELEMENT SEARCHING AND HIGHLIGHTING USING GENERIC THIRD-PARTY DATA; and Concurrently filed U.S. patent application Ser. No. 17/525,184, entitled METHOD FOR SEPARATING LARGE AVIONICS CHARTS INTO MULTIPLE DISPLAY PANELS.

BACKGROUND

Conversion of graphics from visualized forms to an encoded form are process-intensive tasks. Methods to compress images and/or simplify conversion protocols have been developed to decrease the amount of processing necessary for conversion.

One method of image conversion is the use of Run Length Encoded (RLE) vectors. For example, a shape may be virtually sliced into slices, then data derived from each slice is then converted into one or more RLE vectors. Current methods using RLE vector strategies are still process heavy and the time required to convert filled shaped to RLE using standard conversion methods is still excessive. This is particularly true for complex shapes (e.g., having hundreds of thousands of points), which under current RLE conversion methods have a complexity of $O(n^2)$. Accordingly, it would be advantageous to provide a system and method that overcomes the shortcomings described above.

SUMMARY

A method for converting a filled shape to an RLE vector is disclosed. In one or more embodiments, the method includes creating a virtual pixel array of pixel cells corresponding to a graphical array of graphic pixels includes the filled shape, wherein a pixel cell corresponding to a graphic pixel of the filled shape is assigned an "ON" state, wherein a pixel cell not corresponding to the graphical pixel is assigned an "OFF" state. In one or more embodiments, the method further includes determining a border on the virtual pixel array corresponding to the filled shape, wherein the border includes one or more border lines, wherein each border line includes one or more border line elements, wherein each border line element corresponds to a single pixel. In one or more embodiments, the method further includes storing a pixel-type value within each pixel cell that corresponds to a border line element within the pixel, wherein the pixel-type value includes at least one of a start value, a line value, or a vertex value. In one or more embodiments, the method further includes creating a shape RLE group corresponding to a line of pixels aligned along a first axis of the virtual pixel array. In one or more embodiments, creating the shape RLE group includes scanning the virtual pixel array along a first row of the first axis. In one or more embodiments, creating the shape RLE group further includes initiating the shape RLE group upon detecting a pixel cell that has been assigned a start value. In one or more embodiments, creating the shape RLE group further includes extending the shape RLE group upon detection of a subsequently scanned adjacent pixel cell that is assigned an "ON" state. In one or more embodiments, creating the shape RLE group further includes terminating the shape RLE group upon the detection of the adjacent cell that is assigned an "OFF" state. In one or more embodiments, the method further includes storing the position and length of the shape RLE group as a shape RLE vector.

In one or more embodiments, the method further includes continuing the scanning the virtual pixel array along the first axis of the graphical display to the end of the array line, wherein upon reaching the end of the array line, scanning initiates along the second row of the first axis.

In one or more embodiments of the method, the first axis is configured as an X-axis, and the second axis is configured as a Y-axis.

In one or more embodiments of the method, scanning is configured to proceed from left to right along the X-axis.

In one or more embodiments of the method, the filled shape may be configured with an internal unfilled region.

In one or more embodiments of the method, the filled shape is configured to be displayed on a chart.

In one or more embodiments of the method, the chart is configured as a digital flight management system chart.

In one or more embodiments of the method, the method further including clipping the filled shape. In one or more embodiments, clipping the filled shape includes: creating a virtual clip array. In one or more embodiments, clipping the filled shape further includes determining a clip border on the virtual clip array corresponding to the clipped region. In one or more embodiments, clipping the filled shape further includes storing a pixel-type value within each pixel cell that corresponds to a clip line element. In one or more embodiments, clipping the filled shape further includes generating a clip RLE group corresponding to a line of pixels aligned along a first axis of the virtual clip array. In one or more embodiments, clipping the filled shape further includes storing the position and length of the clip RLE group as an RLE vector. In one or more embodiments, clipping the filled shape further includes combining the clip RLE vector and the shape RLE vector to form a clipped shape RLE vector.

In one or more embodiments of the method, the clipped region bounds a region of the filled shape that is visualized.

In one or more embodiments of the method, the clipped region bounds an exclusion zone of the filled shape.

In one or more embodiments of the method, the method is configured with O(n) complexity to compute.

A system is disclosed. In some embodiments, the system includes a controller configured to convert a filled shape to a run length encoded (RLE) vector. In some embodiments, the controller includes one or more processors. In some embodiments, the controller further includes a memory configured to store data and instructions executable by the one or more processors. In some embodiments, the instructions include creating a virtual pixel array of pixel cells corresponding to a graphical array of graphic pixels comprising the filled shape, wherein a pixel cell corresponding to a graphic pixel of the filled shape is assigned an "ON" state, wherein a pixel cell not corresponding to the graphical pixel is assigned an "OFF" state. In some embodiments, the instructions further include determining a border on the virtual pixel array corresponding to the filled shape, wherein the border comprises one or more border lines, wherein each border line comprises one or more border line elements, wherein each border line element corresponds to a single pixel. In some embodiments, the instructions further include storing a pixel-type value within each pixel cell that corresponds to a border line element within the pixel, wherein the pixel-type value includes at least one of a start value, a line value, or a vertex value. In some embodiments, the instructions further include creating a shape RLE group corresponding to a line of pixels aligned along a first axis. In some embodiments, scanning the virtual pixel array along a first row of the first axis. In some embodiments, creating a shape RLE group further includes initiating a shape RLE group upon detecting a pixel cell that has been assigned a start value. In some embodiments, creating a shape RLE group further includes extending the shape RLE group upon detection of a subsequently scanned adjacent pixel cell that is assigned an "ON" state. In some embodiments, creating a shape RLE group further includes terminating the shape RLE group upon the detection of the adjacent cell that is assigned an "OFF" state. In some embodiments, the instructions further include storing the position and length of the shape RLE group as a shape RLE vector.

In one or more embodiments of the system, the filled display is displayed on a chart.

In one or more embodiments of the system, the chart is configured as a digital flight management system chart.

In one or more embodiments of the system, the instructions further include clipping the filled shape. In one or more embodiments of the system, clipping the filled shape includes creating a virtual clip array. In one or more embodiments of the system, clipping the filled shape further includes determining a clip border on the virtual clip array corresponding to the clipped region. In one or more embodiments of the system, clipping the filled shape further includes storing a pixel-type value within each pixel cell that corresponds to a clip line element. In one or more embodiments of the system, clipping the filled shape further includes generating a clip RLE group corresponding to a line of pixels aligned along a first axis of the virtual clip array. In one or more embodiments of the system, clipping the filled shape further includes storing the position and length of the clip RLE group as a clip RLE vector. In one or more embodiments of the system, clipping the filled shape further includes combining the clip RLE vector and the shape RLE vector to form a clipped shape RLE vector.

This Summary is provided solely as an introduction to subject matter that is fully described in the Detailed Description and Drawings. The Summary should not be considered to describe essential features nor be used to determine the scope of the Claims. Moreover, it is to be understood that both the foregoing Summary and the following Detailed Description are example and explanatory only and are not necessarily restrictive of the subject matter claimed.

BRIEF DESCRIPTION OF THE DRAWINGS

The detailed description is described with reference to the accompanying figures. The use of the same reference numbers in different instances in the description and the figures may indicate similar or identical items. Various embodiments or examples ("examples") of the present disclosure are disclosed in the following detailed description and the accompanying drawings. The drawings are not necessarily to scale. In general, operations of disclosed processes may be performed in an arbitrary order, unless otherwise provided in the claims.

DETAILED DESCRIPTION

Figure 1:
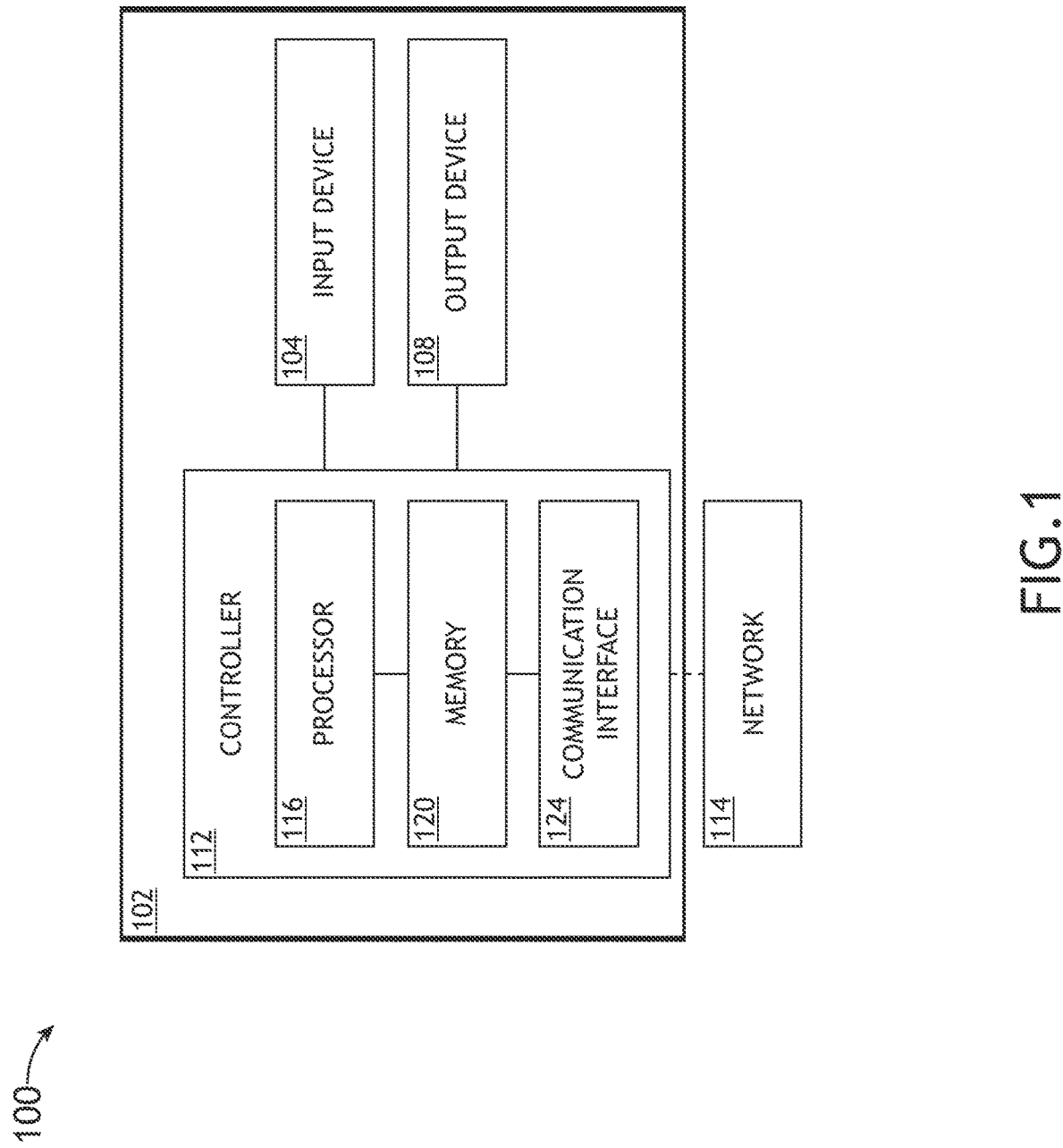
FIG. 1 is a block diagram of a conversion scheme configured to facilitate conversion between filled shapes and RLE vectors, in accordance with one or more embodiments of the disclosure.

Before explaining one or more embodiments of the disclosure in detail, it is to be understood that the embodiments are not limited in their application to the details of construction and the arrangement of the components or steps or methodologies set forth in the following description or illustrated in the drawings. In the following detailed description of embodiments, numerous specific details may be set forth in order to provide a more thorough understanding of the disclosure. However, it will be apparent to one of ordinary skill in the art having the benefit of the instant disclosure that the embodiments disclosed herein may be practiced without some of these specific details. In other instances, well-known features may not be described in detail to avoid unnecessarily complicating the instant disclosure.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only and should not be construed to limit the disclosure in any way unless expressly stated to the contrary.

Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of "a" or "an" may be employed to describe elements and components of embodiments disclosed herein. This is done merely for convenience and "a" and "an" are intended to include "one" or "at least one," and the singular also includes the plural unless it is obvious that it is meant otherwise.

Finally, as used herein any reference to "one embodiment" or "some embodiments" means that a particular element, feature, structure, or characteristic described in connection with the embodiment is included in at least one embodiment disclosed herein. The appearances of the phrase "in some embodiments" in various places in the specification are not necessarily all referring to the same embodiment, and embodiments may include one or more of the features expressly described or inherently present herein, or any combination of or sub-combination of two or more such features, along with any other features which may not necessarily be expressly described or inherently present in the instant disclosure.

A system and method for converting a filled shape to a run length encoded (RLE) vector is enclosed. The method first determines a border around the shape, and defines pixels defining the border for use in creating a shape RLE group. For example, the method identifies initiating pixels within a line of pixels of an image slice that can be used to initiate a shape RLE group. The method also identifies extending pixels that are added to the shape RLE group and/or a termination pixel that ends the shape RLE group. Data from the shape RLE group is then converted into an RLE vector. The method effectively reduces the complexity of multiple point graphics from $O(n^2)$ to $O(n)$. A method for clipping RLE filled areas is also enclosed.

FIG. 1 is a block diagram of a conversion scheme 100 including a system 102 configured to facilitate conversion between filled shapes and RLE vectors, in accordance with one or more embodiments of the disclosure. The system 102 may be configured as a stand-alone monolithic processing device, as a multi-component system, or as a component or module within a larger computing framework. For example, one or more components of the system 102 may be configured as a component or tool within a toolkit for displaying graphics. For instance, in some embodiments, the system 102 is incorporated within an Electronic Charts Application Tool Suite (ECATS) toolkit as described in U.S. Provisional Patent Application Ser. No. 63/278,576 entitled SYSTEMS AND METHODS FOR GENERATION, SELECTION, AND DISPLAY OF MAP-BASED CHART DATABASES FOR USE WITH CERTIFIED AVIONICS SYSTEMS and filed Nov. 12, 2021, which is incorporated by reference in its entirety. The system 102 may include an input device 104, an output device 108, and a controller 112 coupled to the input device 104 and the output device 108 and configured to facilitate the functions of the system 102.

In embodiments, the input device 104 inputs RLE-related data and/or graphical data into the system 102, and may be configured as any type of input device including but not limited to a keyboard, a scanner, a camera, or any type of data port. For example, the input device 104 may be configured as a scanner configured to scan a graphic (e.g., physical avionics chart) into the system. In another example, the input device 104 may be configured as a USB port configured to receive a USB memory device having an avionics chart (e.g., a digital navigation chart a flight management system (FMS)) loaded onto it (e.g., as a pdf. file, jpg. file, or other type of file). In another example, the input device 104 may be configured as a data port connected to a network 114.

In embodiments, the output device 108 may be configured to output RLE-related data and/or graphical data from the system 102 and may be configured as any type of output device 108 including but not limited to a display, a printer, or any type of data port. For example, the output device 108 may be configured as a computer screen. In another example, the output device 108 may be configured as a data port connected to the network 114.

In embodiments, the controller 112 includes one or more processors 116, a memory 120, and a communication interface 124. The one or more processors 116 may include any processor or processing element known in the art. For the purposes of the present disclosure, the term "processor" or "processing element" may be broadly defined to encompass any device having one or more processing or logic elements (e.g., one or more micro-processor devices, one or more application specific integrated circuit (ASIC) devices, one or more field programmable gate arrays (FPGAs), or one or more digital signal processors (DSPs)). In this sense, the one or more processors may include any device configured to execute algorithms and/or instructions (e.g., program instructions stored in memory). In one embodiment, the one or more processors may be embodied as a desktop computer, mainframe computer system, workstation, image computer, parallel processor, networked computer, or any other computer system configured to execute a program configured to operate or operate in conjunction with the system 102, as described throughout the present disclosure. Moreover, different subsystems of the system 102 may include a processor or logic elements suitable for carrying out at least a portion of the steps described in the present disclosure. Therefore, the above description should not be interpreted as a limitation on the embodiments of the present disclosure but merely as an illustration.

The memory 120 can be an example of tangible, computer-readable storage medium that provides storage functionality to store various data and/or program code associated with operation of the controller 112 and/or other components of the system 102, such as software programs and/or code segments, or other data to instruct the controller and/or other components to perform the functionality described herein. Thus, the memory can store data, such as a program of instructions for operating the system 102 or other components. It should be noted that while a single memory 120 is described, a wide variety of types and combinations of memory 120 (e.g., tangible, non-transitory memory) can be employed. The memory can be integral with the controller, can comprise stand-alone memory, or can be a combination of both. Some examples of the memory 120 can include removable and non-removable memory components, such as random-access memory (RAM), read-only memory (ROM), flash memory (e.g., a secure digital (SD) memory card, a mini-SD memory card, and/or a micro-SD memory card), solid-state drive (SSD) memory, magnetic memory, optical memory, universal serial bus (USB) memory devices, hard disk memory, external memory, and so forth.

The communication interface 124 can be operatively configured to communicate with components of the controller 112 and other components of the system 102. For example, the communication interface 124 can be configured to retrieve data from the controller 112 or other components, transmit data for storage in the memory 120, retrieve data from storage in the memory 120, and so forth. The communication interface 124 can also be communicatively coupled with controller 112 and/or system elements to facilitate data transfer between system components.

Figure 2A:
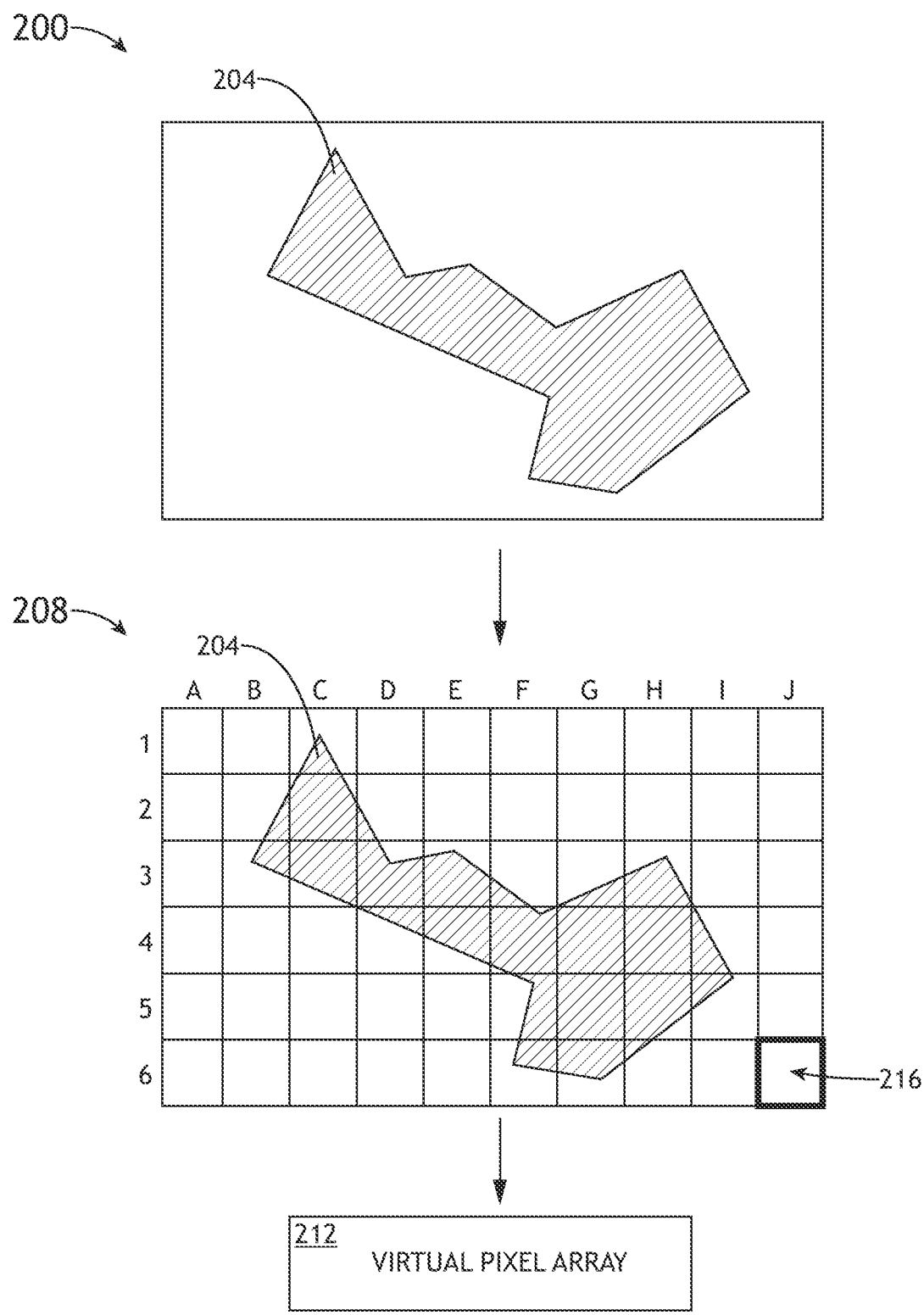
FIG. 2A is a diagram illustrating a display area that includes a filled graphic, and a corresponding graphical array and virtual pixel array, in accordance with one or more embodiments of the disclosure.

FIG. 2A is a diagram illustrating a display area 200 that includes a filled shape 204, and a corresponding graphical array 208 and virtual pixel array 212, in accordance with one or more embodiments of the disclosure. The display area 200 may be configured as any type of viewable area such as a display screen, or a printed image that includes the filled shapes 204 that are to be processed. Processing of the display area 200 includes digitizing and converting the display area 200 into the virtual pixel array 212, which is a mathematical construct. The graphical array 208 is a visualized representation of the virtual pixel array 212, made up of individual pixels 216. Each pixel 216 corresponds to a specific pixel cell within the virtual pixel array 212. In this disclosure, the terms graphic pixels, pixels and pixel cells may be used interchangeably when describing a detail of the filled shape 204 or the display area 200. Several types of pixels 216 are described herein and may be differentiated from each other by an added descriptive name (e.g., an ON pixel 216 versus an OFF pixel 216). The terms graphic array 208 and virtual pixel array 212 may be used interchangeably when describing a detail or conversion of the filled shape 204 or the display area 200. The following paragraphs will describe the breakdown of the shape and shape outlines into elements defined within individual pixels 216.

Figure 2B:
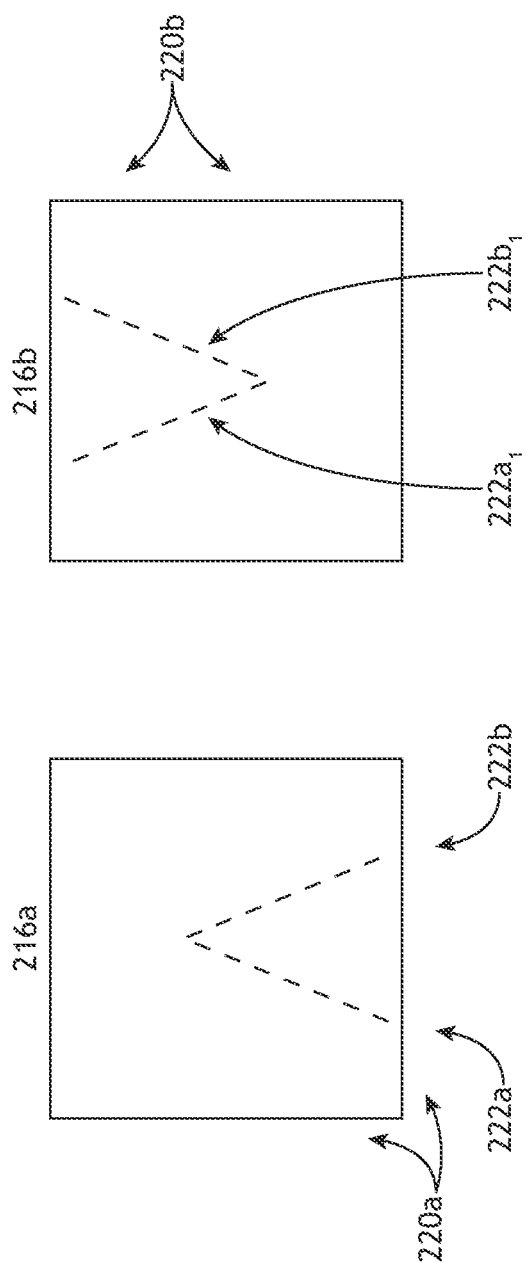
FIG. 2B is a diagram illustrating two pixels configured with borders configured as vertices, in accordance with one or more embodiments of the disclosure.

FIG. 2B is a diagram illustrating two pixels 216a-b configured as a section of a border 220a-b, in accordance with one or more embodiments of the disclosure. Individual components are of the border 220a-b within a pixel 216a-b are termed border elements 222a-b. For example, in FIG. 2B, the border elements 222a-$b_1$ are coupled within each pixel 216a-b, creating vertices. For example, border elements 222a-b form an upward vertex, whereas border elements 222$a_1$-$b_1$ form a downward vertex. Pixels 216 define the smallest area within a display area 200 that can be assigned to be drawn. Any pixel 216 containing a border element 222 is assigned an "ON" designation (e.g., an "ON" pixel 216 is a pixel 216 that is instructed to be filled in, colored, shaded, or otherwise activated). Any pixel 216 that does not contain a border element 222 and is not instructed to be filled in, colored, shaded, or otherwise activated is assigned an "OFF" designation. Pixels 216 may be configured as any size and shape, and any two sides of a single pixel may be configured with different lengths. Pixels 216 assigned designations or other values will be stored via the controller 112, processors 116, and memory 120 within the corresponding pixel cell.

Figure 2C:
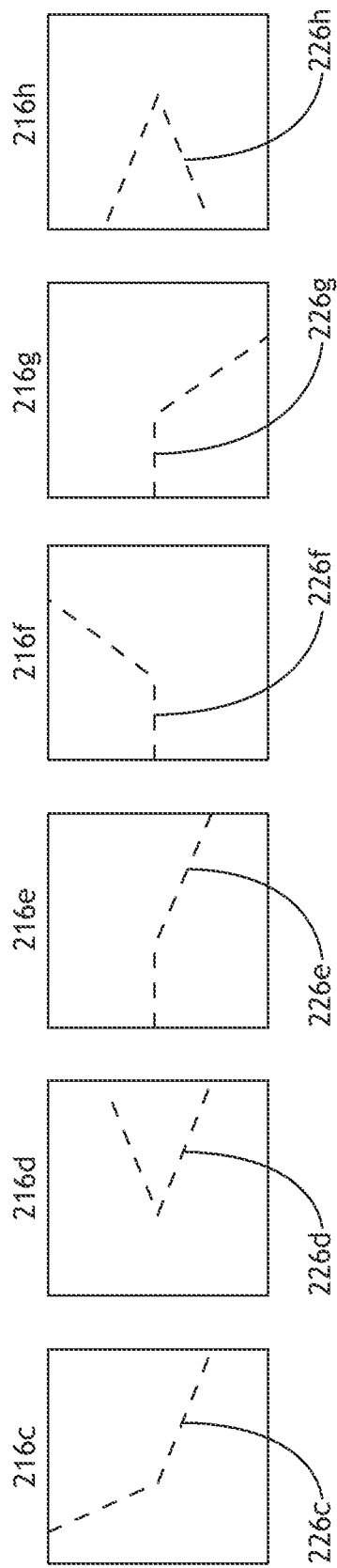
FIG. 2C is a diagram illustrating six pixels configured with borders, in accordance with one or more embodiments of the disclosure.

FIG. 2C is a diagram illustrating six pixels 216c-h configured with portion of borders 220c-h, in accordance with one or more embodiments of the disclosure. The coupled border elements 222 within each pixel 216c-h are also configured as extensions, which include all vertices that are not pointing up or down and include at least one border element 222 that appears to extend into an adjacent (e.g., left or right) pixel 216. Extensions (e.g., designated in this disclosure as "X") may be further defined and labeled as a line (e.g., designated in this disclosure as "L") or a start (e.g., designated in this disclosure as "S") during the initial steps for RLE vector processing, as detailed below. Along with vertices, which are designated as "V", the extension (X), line (L), start (S) and vertex (V) designations are termed pixel-type values, which determine a designation of pixel 216 that contains one or more border elements 222. For example, a pixel 216 containing a vertex or vertex pixel-type value is a vertex pixel 216, a pixel 216 containing an extension or an extension pixel-type value is an extension pixel 216, a pixel 216 containing a line or a line pixel-type value is a line pixel 216, and a pixel containing a start or a start pixel-type value is a start value pixel 216.

Figure 2D:
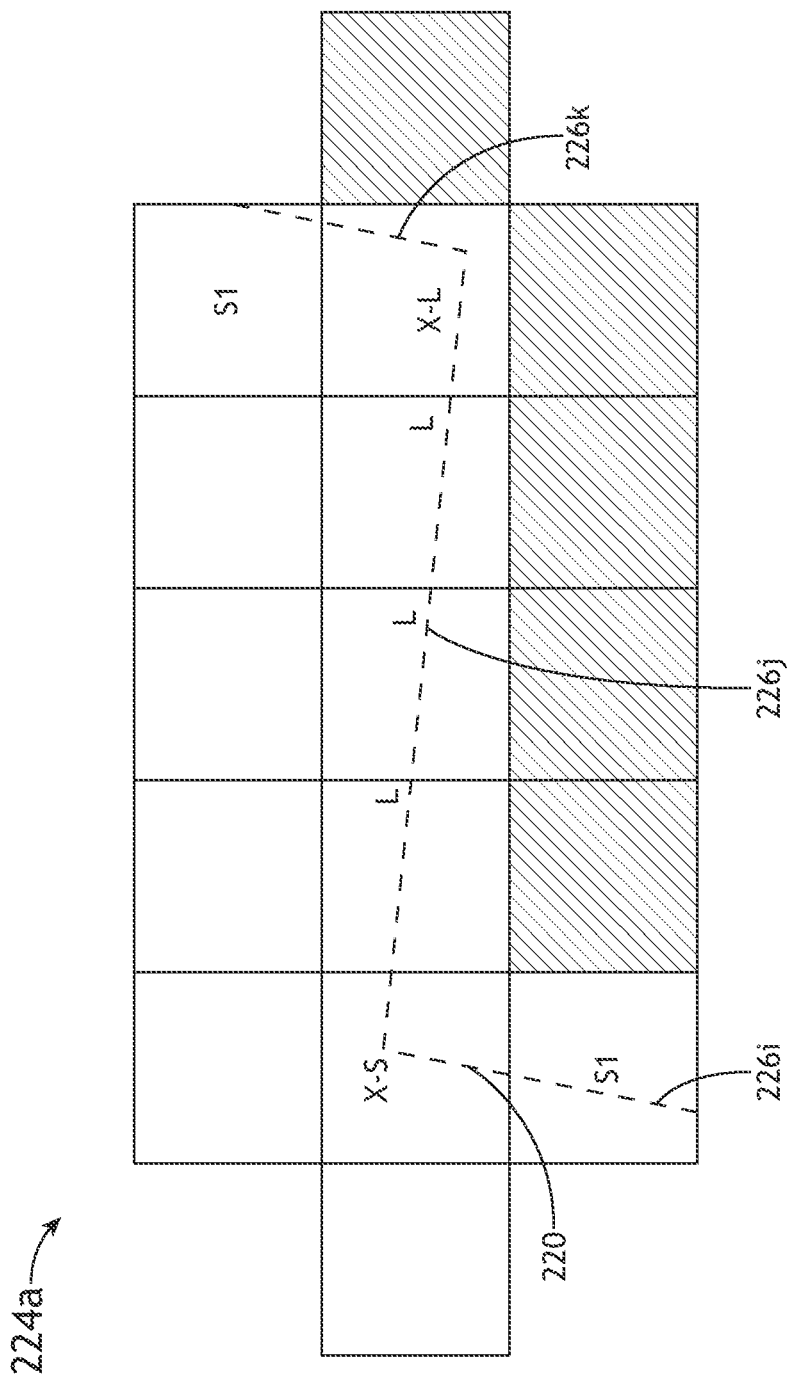
FIG. 2D is a diagram illustrating an interface between a filled shape and an open area intersected with a border, in accordance with one or more embodiments of the disclosure.
Figure 4A:
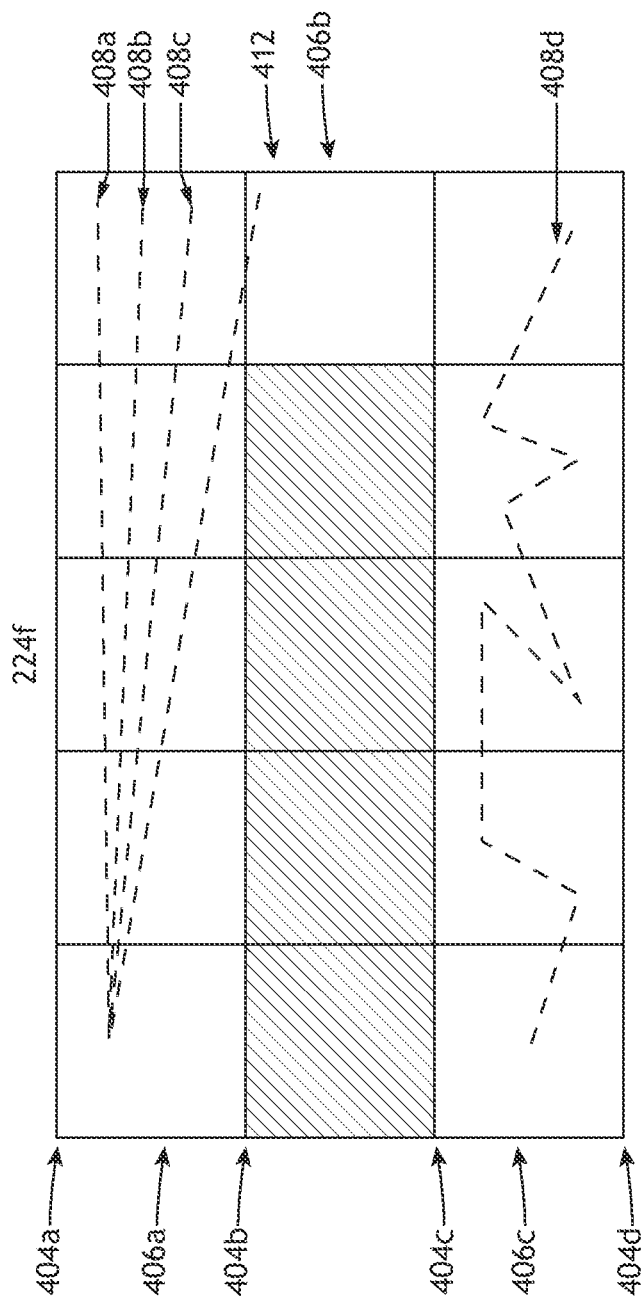
FIG. 4A is a block diagram illustrating a filled shape section, in accordance with one or more embodiments of the disclosure.
Figure 4B:
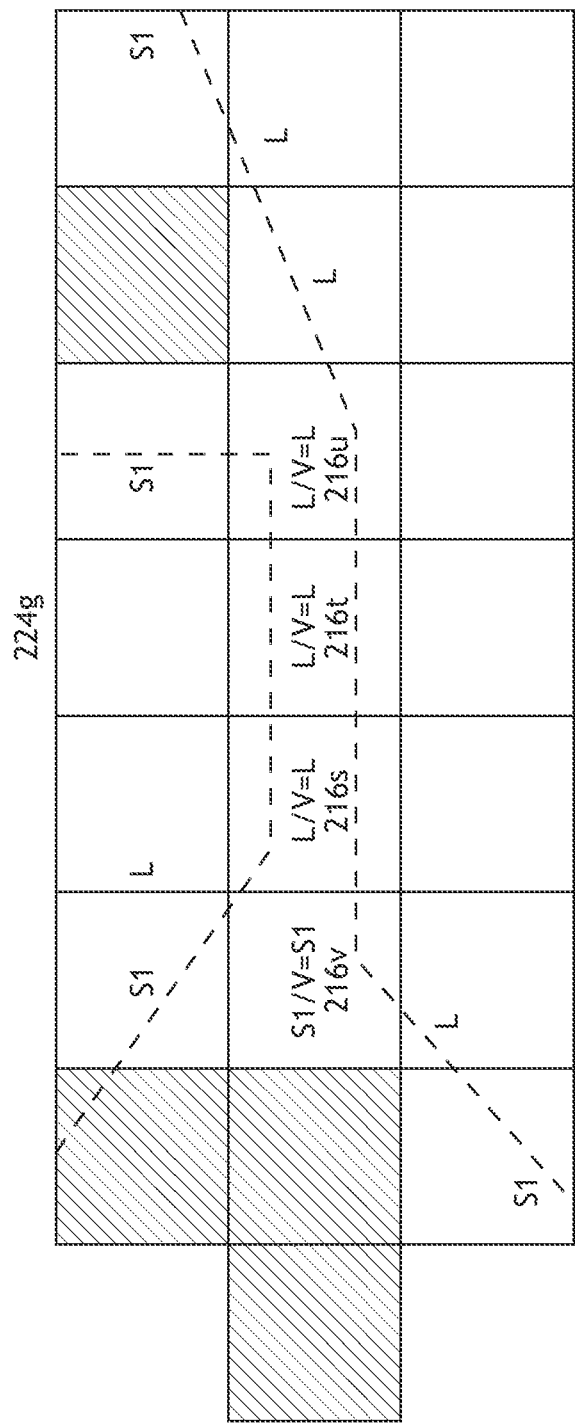
FIG. 4B is a block diagram illustrating a filled shape section, in accordance with one or more embodiments of the disclosure.

FIG. 2D is a diagram illustrating an interface between a section of a filled shape 204 (e.g., a shape section 224a) and an open, unshaded area of OFF pixels 216 (e.g., as designated by diagonal lines) intersected by a border 220, in accordance with one or more embodiments of the disclosure. The border 220 comprises border lines 226i-k, which are themselves comprised of individual border elements 222. Pixels 216 comprising the border line 226j are themselves arranged in a straight line. However, the arrangement of individual border elements 222 within a pixel 216 of a line of pixels may be straight or non-straight, (e.g., the border elements within a pixel 216 may be arranged as zigzag-like, as shown in FIG. 4A).

Rules disclosed herein for processing filled shapes 204 into RLE vectors require that each leftmost pixel 216 contained within a horizontal row of pixels 216 in a border line 226 is designated as a start pixel 216 (e.g., "S"). However, different implementations of the rules may also consider any first pixel 216 within a row or column of an X- or Y-axis as the first pixel 216. Therefore, the invention should not be construed as being limited to the description in following the embodiments and examples. For example, the rightmost pixel 216 contained within the horizontal row of pixels 216 may be given the start pixel 216 designation. In another example, the uppermost pixel 216 contained within a vertical row of pixels 216 may be given the start pixel designation. In another example, the lowermost pixel 216 within a vertical row of pixels 216 may be given the start pixel 216 designation. The start pixel may also be further defined by the number of border lines 226 drawn through the start pixel 216 (e.g., the start pixel 216 may be designated with an incremental value depending on the number of line elements drawn through the start pixel 216). For example, a start pixel 216 that comprises one border line 226 may be designated "S1", whereas a start pixel 216 including two border lines 226 may be designated "S2".

Referring to FIG. 2D, and as described above, each pixel 216 containing a border line element 222 is given a pixel-description designation (e.g., S, L, X or V) depending on the designation rules. For example, the leftmost pixel 216 in each horizontal row of pixels 216 that includes a border line element is designated S1 (e.g., or was originally defined an extension "X", then redefined as S1). In another example, each set of pixels 216 within a line connecting start pixels 216 is designated L (e.g., or was originally defined as an extension, then redefined as L). A start pixel 216 that is also a vertex is overridden as a vertex "V".

Figure 2E:
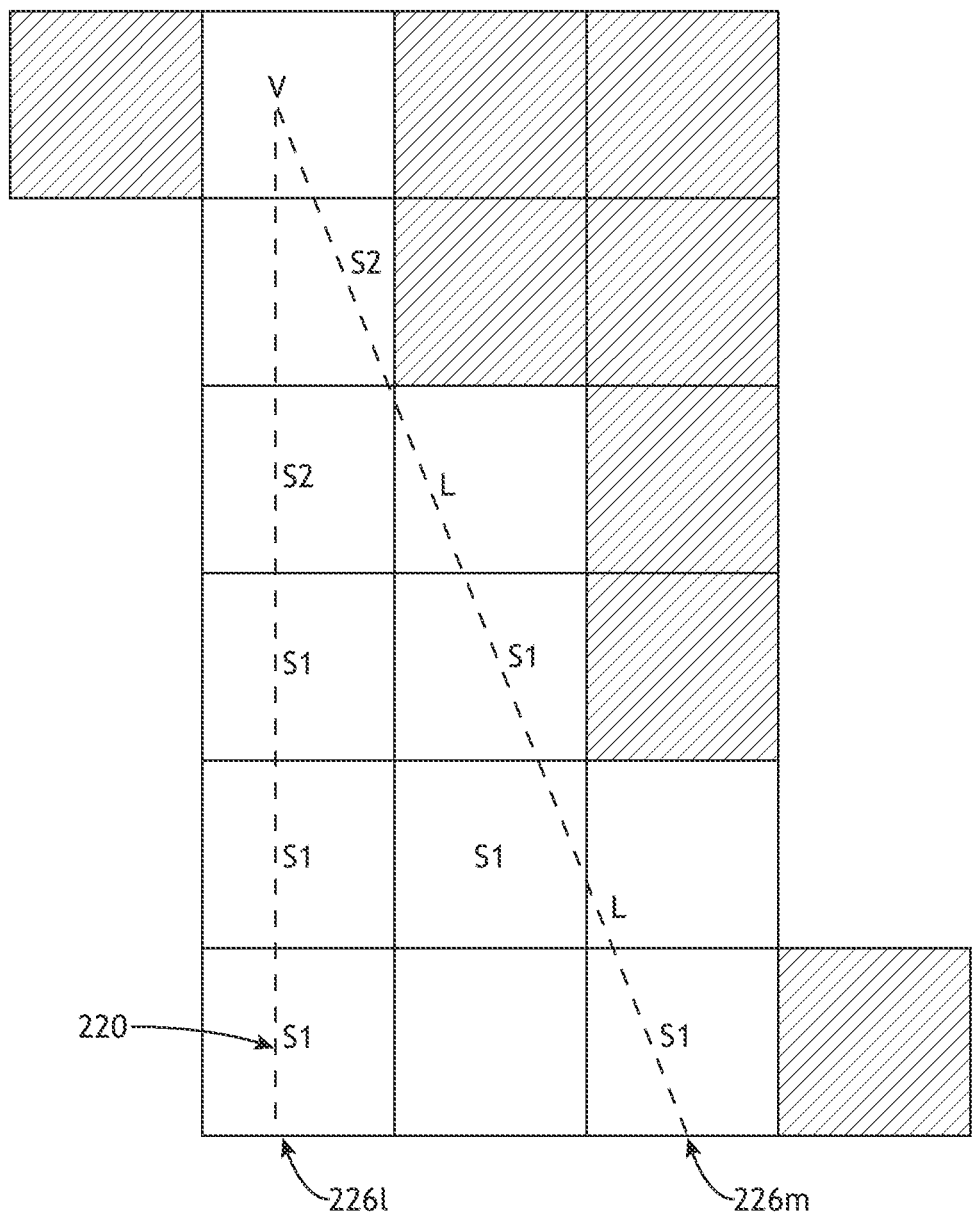
FIG. 2E is a diagram illustrating a filled shape section of a filled shape bordered by OFF pixels, in accordance with one or more embodiments of the disclosure.

FIG. 2E is a diagram illustrating a filled shape section 224b, in accordance with one or more embodiments of the disclosure. The filled shape section 224b includes several start pixels 216 with one line border line 226 (e.g., pixels 216 containing either border line 226l or border line 226m labeled "S1"), two start pixels 216 with two border elements 226l-m (e.g., labeled "S2"), and two-line pixels 216 that are an extension between the start pixels 216. One vertex pixel 216 (e.g., labeled "V") is also defined.

Figure 2F:
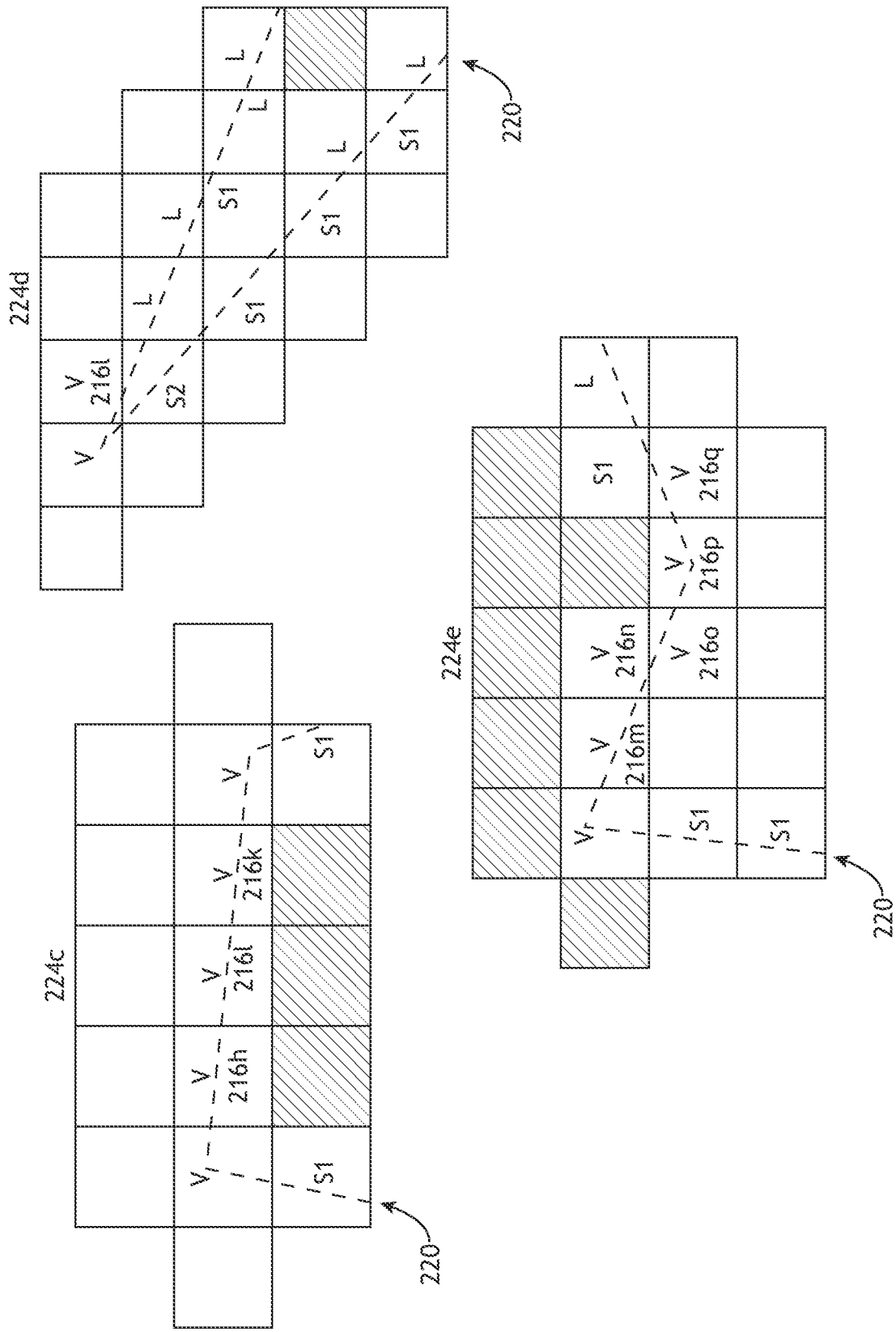
FIG. 2F is a diagram illustrating three filled shape sections, in accordance with one or more embodiments of the disclosure.

FIG. 2F is a diagram illustrating three filled shape sections 224c, 224d and 224e in accordance with one or more embodiments of the disclosure. Each filled shape section 224c, 224d, 224e includes a top, leftmost pixel 216 that is designated as a vertex pixel 216 (e.g., the vertex pixel 216 designation is overriding). Pixels 216 that extend horizontally from a vertex within the same row of pixels are also overriding and designated as a vertex pixels "V". For example, pixels 216h-216k extend from the upper leftmost pixel 216 of filled shape section 224, and are designated as vertex pixels 216. Pixel 216p of filled section 224e is also designated as a vertex pixel 216 due to the shape of the connected border elements 222. Pixels 216o and 216q include border elements that extend from pixel 216p, and are thus designated as vertex pixels 216.

Figure 3:
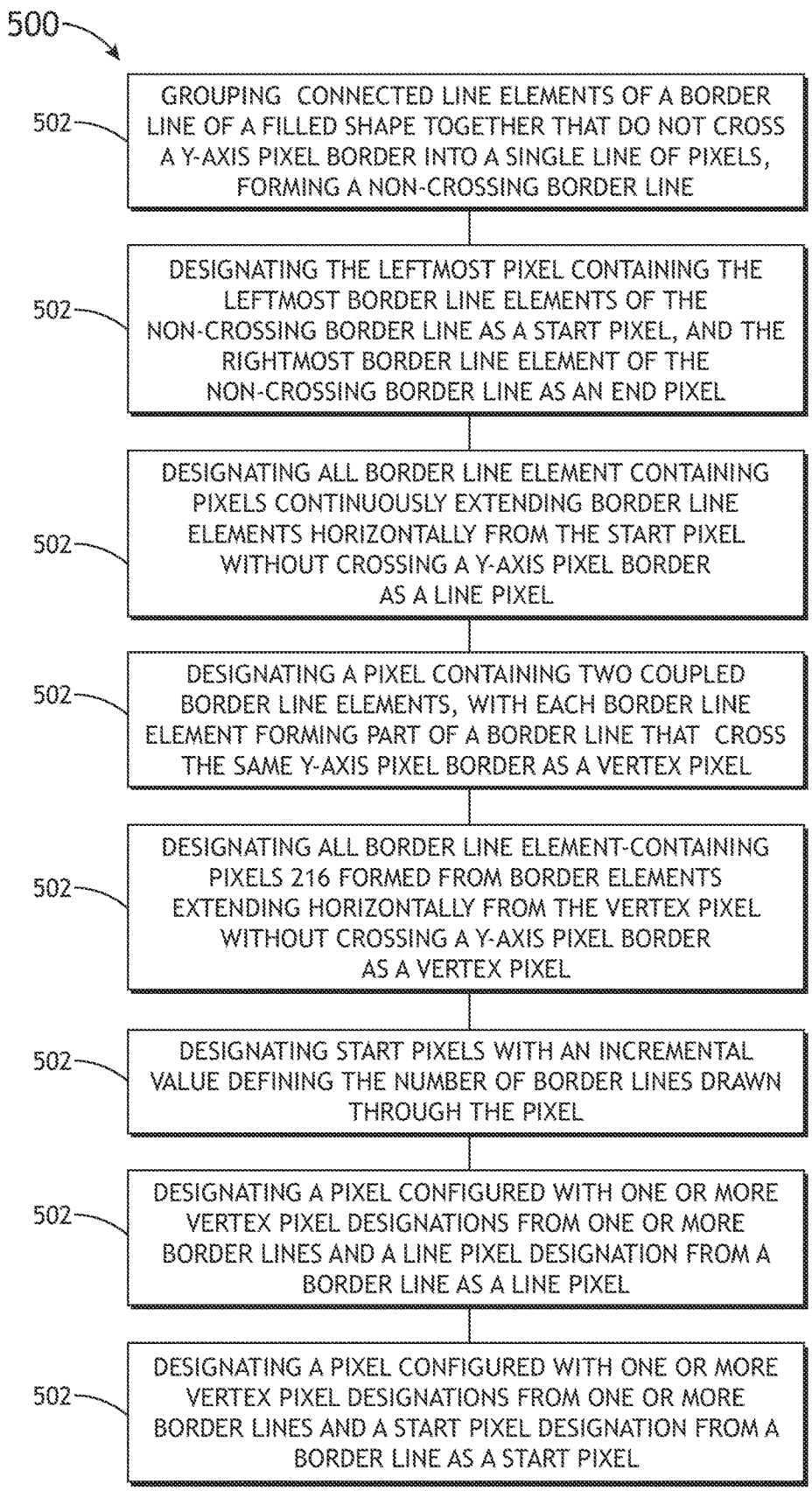
FIG. 3 is a flow diagram illustrating a method for assigning designations to pixels disposed on the border of a filled shape, in accordance with one or more embodiments of the disclosure.

FIG. 3 is a flow diagram illustrating a method 300 for assigning designations to pixels 216 disposed on the border 220 of a filled shape 204, in accordance with one or more embodiments of the disclosure. The method 300 combined the steps or rules assigning designations to pixels 216 before conversion as stated above into RLE vectors as shown in FIGS. 2A-2F and FIG. 4A-4B.

In embodiments, the method 300 includes a step 310 of grouping connected border elements 222 of a border line 226 of a filled shape 204 together that do not cross an X-axis pixel border 404a-d into a pixel line 406a-c containing non-crossing border lines 408a-d. For example, grouping connected border elements 222 may be performed by "stepping through" a group of border lines 226 representing the border 220 of a filled shape 204. Examples of non-crossing border lines 408a-d are shown in FIG. 4A, in accordance with one or more embodiments of the disclosure. For example, non-crossing border lines 408a-c reside within pixel line 406a, while non-crossing border line 408d resides within pixel line 406d. In contrast, the crossed border line 412 crosses the X-axis border 404b, causing the crossed border line 412 to be divided, being grouped partially in pixel line 406a, and in pixel line 406b (e.g., pixel line 406b comprising a single pixel 216.

In embodiments, the method 300 further includes a step 320 of designating the leftmost pixel 216 containing the leftmost border elements 222 of the non-crossing border line 408 as a start pixel 216, and the rightmost border line element 222 of the non-crossing border line as an end pixel. Some non-crossing border lines 408 may include only one pixel 216, as in pixel line 406b.

In embodiments, the method 300 further includes a step 330 of designating all border line element-containing pixels 216, continuously extending border elements 222 horizontally from the start pixel 216 without crossing an X-axis pixel border 404 as a line pixel ("L"). For example, in FIG. 2D, pixels 216 that extend from the start pixel 216 the border line 226b that does not cross any X-axis border are designated as line pixels 216.

In embodiments, the method 300 further includes a step 340 of designating a pixel 216 containing two coupled border elements 222, formed from border lines 226 that cross the same X-axis pixel border as a vertex pixel 216. For example, in FIG. 2E, the border elements 222 of the top filled pixel of the filled section 224b are formed form border lines 226 that cross the same X-axis pixel border 404, defining the pixel 216 as a vertex pixel 216. In another example, in FIG. 2F, the top, leftmost pixel 216 of the filled section 224d containing border elements 222 is configured with one border line element 222 entering from its bottom X-axis pixel border 404 (e.g., immediately adjacent to a corner of the pixel 216), which is coupled to border line element 222 formed form a border line 226 that crosses to the right into adjacent pixel 216, then crosses the same X-axis pixel border 404, defining the left most pixel 216 of the border line 226 as a vertex pixel 216.

In embodiments, the method 300 further includes a step 350 of designating all border line element-containing pixels 216 formed from border elements extending horizontally from the vertex pixel 216 as a vertex pixel 216. For example, in filled area 224c of FIG. 2F, pixels 216h-k extend horizontally from the leftmost vertex pixel and are thus assigned as a vertex pixel 216. In another example, pixels 216o and 216q contain border lines 226 that extend from vertex pixel 216p, and are this designated a vertex pixel 216.

In embodiments, the method 300 further includes a step 360 of designating start pixels 216 with an incremental value defining the number of border lines 226 drawn through the pixel 216. For example, in FIG. 2E, the top two start pixels contain border elements 222 from two border lines 226 and are assigned the designation "S2", whereas all other start pixels 216 contain only border line 226 and are assigned the designation "S1".

In embodiments, the method 300 further includes a step 370 of designating a pixel 216 configured with one or more vertex pixel 216 designations from one or more border lines 226 and a line pixel 216 designation from a border line as a line pixel 216. For example, in FIG. 4B, filled section 224g includes three pixels 216s-u that contain border elements 222 from both an upper border line and a lower border line, each defining and designating pixels 216s-u as vertex pixels 216 and line pixels 216, respectively, based on steps 310 to step 360. For pixels 216 configured with both vertex pixel 216 and line pixel 216 designations based on the multiple border lines 226 passing through the pixel 216, the line pixel designation overrides the vertex pixel 216 designation. Therefore, pixels 216s-u are assigned a line pixel 216 designation.

In embodiments, the method 300 includes a step 380 of designating a pixel 216 configure with one or more vertex pixel 216 designations from one or more border lines 226 and a line pixel 216 designation from a border line as a start pixel 216. For example, in FIG. 1B, filled section 22g includes pixel 216v containing border elements 222 from both an upper border line and a lower border line, each defining and designating pixels 216v as vertex pixels 216 and start pixels 216, respectively, based on steps 310 to step 360. For pixels 216 configured with both vertex pixel 216 and start pixel 216 designations based on the multiple border lines 226 passing through the pixel 216, the start pixel 216 designation overrides the vertex pixel 216 designation. Therefore, pixel 216v is assigned a start pixel 216 designation.

Border elements 222, or points of border elements 222 can land exactly on pixel boundaries (e.g., or pixel cell boundaries). In this case, the border element or point should be placed in either pixel 216 sharing the pixel boundary, and these placements should be consistent. In a similar manner, border lines 226 may cross at exact pixel boundaries (e.g., an X-axis pixel border 404 or a Y-axis pixel boundary). In these cases, the border elements 222 of these border lines 226 may be placed on either side of the pixel boundary, and should be placed consistently.

Points (e.g., border elements smaller than a pixel 216) may be discarded, but their position may not be discarded. For example, if a border line 226 is shorter than a pixel 216 and extends upward half a pixel 216, further line and position calculations should be made from the higher point, even though the pixel 216 may be combined with another pixel 216 for drawing purposes.

The last border line 226 in a filled shape 204 will either be configured as a "close" command, or a line that terminates at the original start location. The original starting point (e.g., a pixel 216), which may have been designated as an extension, is reprocessed with according to new data acquired in assigning designations to other border pixels 216, and following the steps 310-380. The pixel 216 containing the original starting point may be reassigned as a start pixel 216, a line pixel 216, or a vertex pixel 216. It may be necessary to reprocess additional parts of the border 220 after considering data derived from "closing" the border.

Once the border has been closed, the shape is fully traversed within the pixel array 208. For instance, in some embodiments, traversing top to bottom processing each row left to right. Processing of each row begins RLE processing. As noted herein, the traversal and the direction of processing may be left-to-right, right-to-left up-to-down, or down-to-up, but is performed in the same directions within the filled shape 204.

Figure 5A:
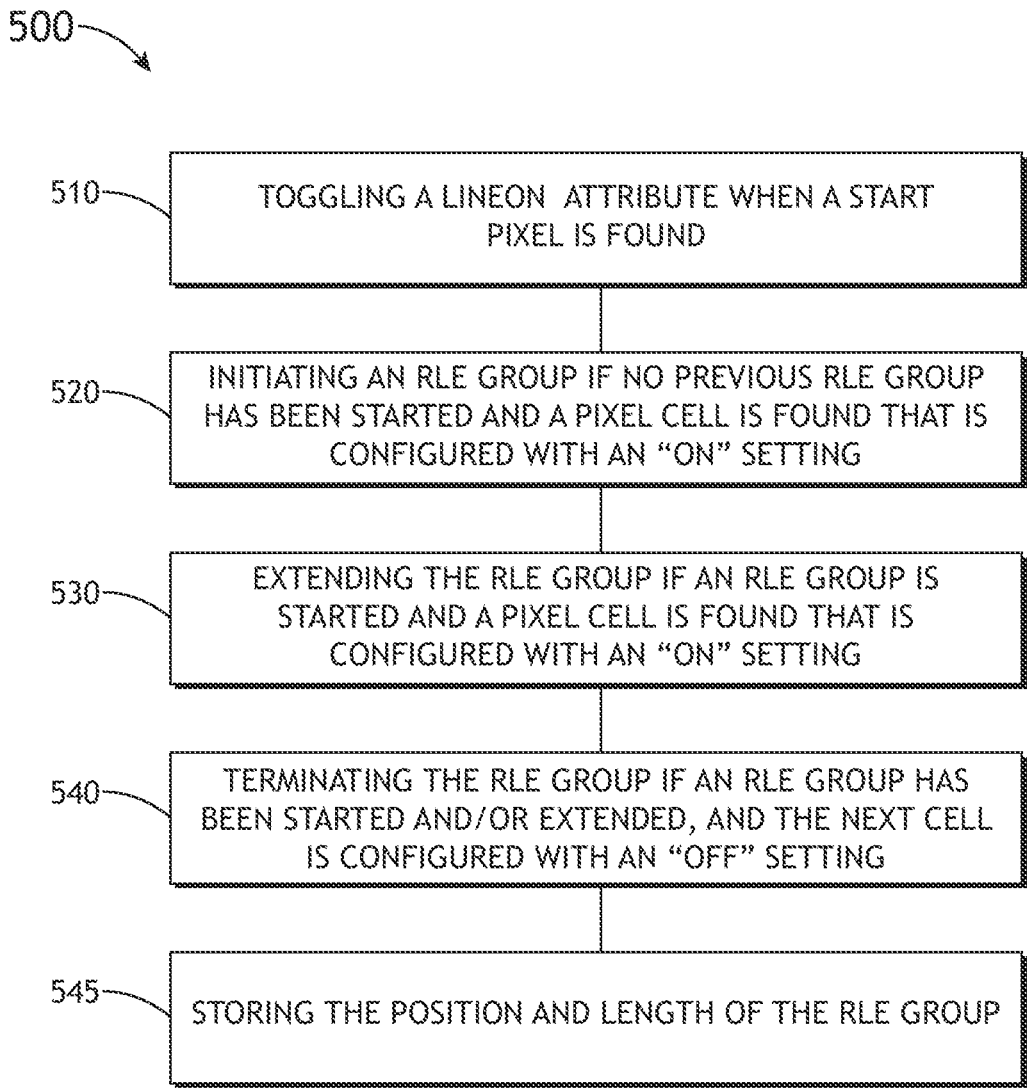
FIG. 5A is a flow diagram illustrating a method for assigning pixel cell data shape RLE groups, in accordance with one or more embodiments of the disclosure.

When all of the border lines 226 of the filled shape 204 have been processed, and every pixel 216 has been assigned a designation, shape RLE grouping will begin. FIG. 5A is a flow diagram illustrating a method 500 for assigning pixel cell data (e.g., data based on assigned designations to border pixels 216) to shape RLE groups, in accordance with one or more embodiments of the disclosure. Processing the filled shape 204 may be performed (e.g., scanned) in a left to right manner for each row of pixels 216, as described below. However, the method 500 may also be performed in a right to left manner. Processing may be started outside of the filled shape 204, where it is assumed that there is no fill.

In some embodiments, the method 500 includes a step 510 of toggling a LineOn attribute when a start pixel 216 is found. For example, if the LineOn attribute is originally set to an "OFF" setting, upon detecting a start pixel 216, the LineOn attribute will be set to an "ON" setting. Conversely, if the LineOn attribute is originally set to an "ON" setting, upon detecting a start pixel 216, the LineOn attribute will be set on an "OFF" setting.

In some embodiments, the method 500 further includes a step 520 of initiating a shape RLE group if no previous shape RLE group has been started and a pixel cell is found that is configured with an "ON" state. For example, a pixel cell correlated to a start pixel 216, and having an "ON" state will be placed as the first pixel cell in a shape RLE group.

In some embodiments, the method 500 further includes a step 530 of extending the shape RLE group if a shape RLE group is started and a pixel cell is found that is configured with an "ON" setting. For example, a pixel cell (e.g., designated as a line pixel 216 or a non-border pixel 216) that has been detected immediately to the right of a pixel cell that has been added to a shape RLE group and having an "ON" state will also be added to the shape RLE group. As described herein, all "ON" pixels cells represent pixels 216 that are filled, all pixel cells designated as start pixels 216, line pixels 216, vertex pixels 216, or other markings may also be configured with an "ON" setting.

In some embodiments, the method 500 further includes a step 540 of terminating the shape RLE group if a shape RLE group has been started and/or extended, and the next cell is configured with an "OFF" setting. For example, if upon scanning left to right through the row of pixel cells, that correspond to a filled shape 204, an initiated and/or extended RLE that detects the next pixel cell as configured with an "OFF" setting will result in termination of the shape RLE group.

In some embodiments, the method 500 further includes a step 545 of storing the position and length of the shape RLE group. For example, the position and length of shape RLE groups may be stored as an RLE vector in memory 120.

The conversion of filled shapes 204 to RLE vectors may include filled shapes 204 containing arcs, with multiple start pixels 216 designated at each crossing of each X-axis border 404. This process may also be extended to complex internal shape processing. For example, the process may be used to convert filled shapes 204 having unfilled internal areas, such as a doughnut shape.

The implementation of the RLE vector conversion may include storing data with a single number (e.g., such as "0") representing an "OFF" setting, and another single number (e.g., such as "1") representing an "ON" setting. Indeterminate pixels, such as extensions, may be represented with another single number (e.g., such as "−1").

For large shapes that are memory intensive, the process may be chunked into a set of subarrays. For example, the process may be modified to use less memory by setting an arbitrary rectangle set (e.g., a rectangle outline) of X and Y boundaries overlaid upon a portion of the large shape. Sub-shapes within the large shape corresponding to the rectangle outline are then processed. The entire sub-shape then will be scanned with locations calculated and the location of the shape is noted and saved. Multiple rectangle shapes may be overlaid upon the large shape in this manner. Lines from single sub-shapes that end at a border of the rectangle shape may be connected with a line (e.g., such as through a set of start pixels 216 or start points), and further processed into an RLE. Once all overlaying RLEs within the multiple rectangle outline have been processed, the shape RLE groups may be sorted by position and stitched together.

The total final space taken by the encoded shape may be minimized by performing a first pass analysis on the shape and storing the maximum X and Y values of the shape. These values may then be used to determine if RLE processing should be performed horizontally, vertically, or in an angled position between horizontal and vertical. For example, a shape that is taller than wide will process with fewer lines if processing is performed vertically, rather than horizontally. The shape may then be rotated or the system 102 adjusted, so that RLE processing can be performed with fewer lines.

Figure 5B:
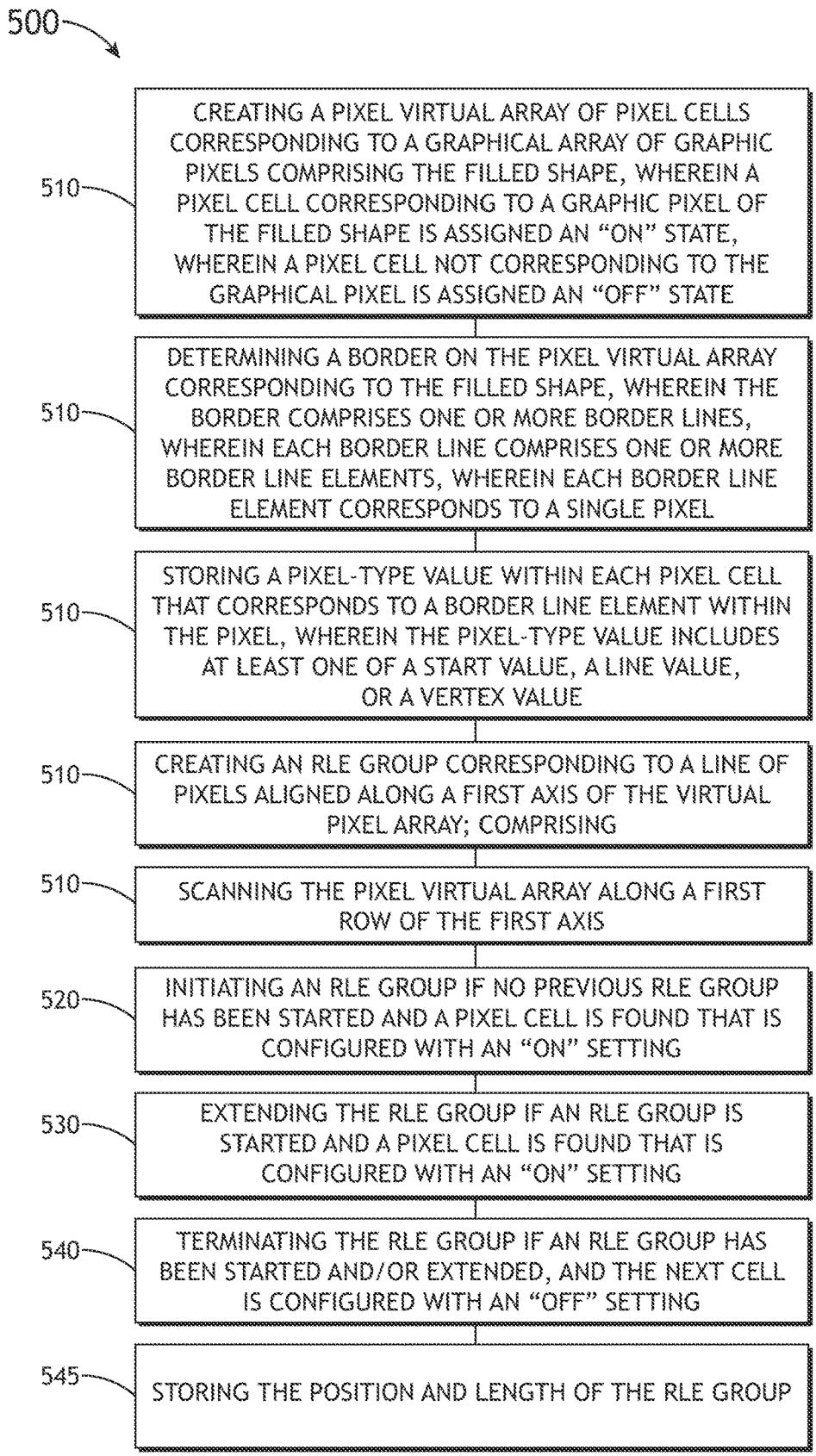
FIG. 5B is a block diagram illustrating a method for converting a filled shape to an RLE vector, in accordance with one or more embodiments of the disclosure.

FIG. 5B is a block diagram illustrating a method 550 for converting a filled shape 204 to an RLE vector, in accordance with one or more embodiments of the disclosure. The method 550 provides an overall method for filled shape 204 to RLE vector conversion, and may extend, may be extended from, or may include one or more steps of methods 300, 500.

In embodiments, the method 550 includes a step 555 of creating a virtual pixel array 212 or pixel cells corresponding to a graphical array 208 of pixels 216 comprising the filled shape 204, wherein a pixel cell corresponding to a pixel 216 of the filled shape 202 is assigned an "ON" state, wherein a pixel cell not corresponding to the pixel 216 is assigned an "OFF" state. The graphical array 208 may be configured as a either a physical or virtual grid placed over a visualized filled shape 204 (e.g., a filled shape 206 on a display screen or a printed sheet). As detailed above, the virtual pixel array 212 is a mathematical representation of the graphical array.

In embodiments, the method 550 includes a step 560 of determining a border 200 on the virtual pixel array 212 corresponding to the filled shape 204, wherein the border 200 comprises one or more border lines 226, wherein each border line comprises one or more border line elements 222, wherein each border line element 222 corresponds to a single pixel 216. For example, if a border line 226 (e.g., a straight line) enters slightly into a pixel 216, the pixel 216 will contain one border line element (e.g., the terminal tip of the border line 226), and the pixel will be assigned an "ON" state. As mentioned herein, a pixel not containing a border line element 222 will be assigned an "OFF" state.

In embodiments, the method 550 further includes a step 565 of storing a pixel-type value within each pixel cell that corresponds to a border line element 222 within the pixel 216, wherein the pixel-type value includes at least one of a start value (S), a line value (L), or a vertex value (V). The pixel-type values for each pixel 216 on the border 200 are determined via the rules described herein, with some pixels 216 having initially assigned pixel-type values that change to due reprocessing and hierarchy rules (e.g., extension (X) pixel-type values changed to start (S) pixel-type values or line (L) pixel-type values, and vertex (V) pixel-type values).

Figure 5C:
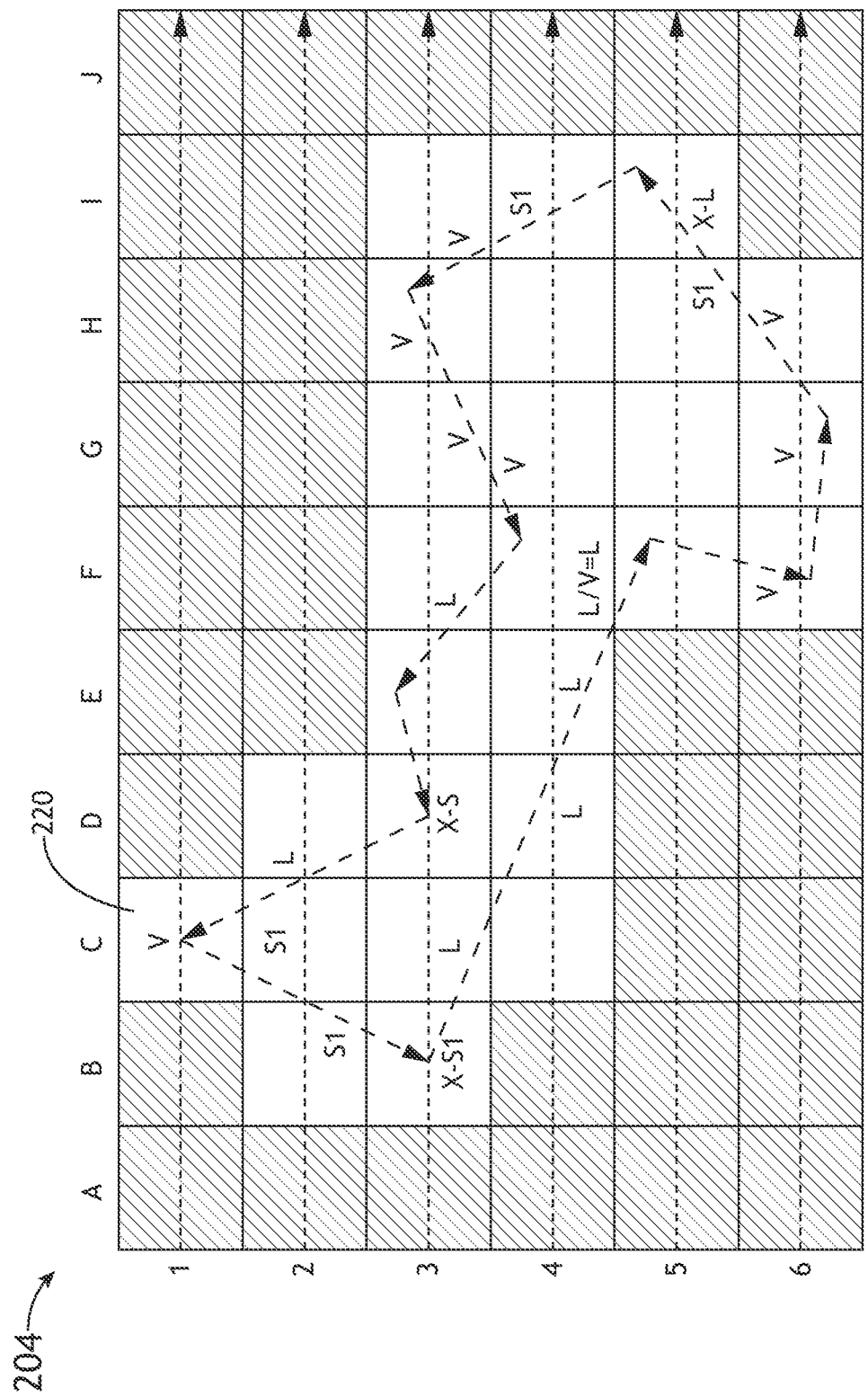
FIG. 5C is a drawing illustrating a filled shape configured with assigned on the shape border, in accordance with one or more embodiments of the disclosure.

A complete assignment of the pixels 216 aligned on the border 220 of a filled shape 204 is shown in FIG. 5C in accordance with one or more embodiments of the disclosure. As the filled shape 204 is completely encircled by the border 220, any point along the border may be selected as the initial point and corresponding pixel 216 for determining pixel-type values. The process proceeds stepwise along the border 220 until all pixels 216 on the border 220 have been assigned a pixel-type value. The stepwise process may be accomplished in either a clockwise or counterclockwise fashion. In this manner, each pixel cell of the virtual pixel array 212 that corresponds to a pixel 216 of the border 220 of the graphical array 208 and/or filled shape 204 will store a value that will later be scanned for implementation into a shape RLE group (e.g., in a left-to-right manner, or other processing mode as described herein).

In embodiments, the method 550 further includes a step 570 of creating a shape RLE group corresponding to a line of pixels 216 aligned along a first axis of the virtual pixel array. For example, a line of pixels 216 along an X-axis responding to a horizontal slice of the filled shape 204 may be assigned to a shape RLE group. For instance, rows 1-6 of FIG. 5C each constitute a line of pixels 216 that will each be assigned to a shape RLE group. The line of pixels 216 may contain a start pixel 216 (e.g., the leftmost pixel 216 containing a border element 222) and an end pixel 216 (e.g., the rightmost "ON" pixel).

In embodiments, the method 550 further includes a step 575 of scanning the virtual pixel array 212 along a first row of the first axis. The first row may correlate to any row within the display area 200. For example, the scanning may begin at a top, leftmost pixel cell of the virtual pixel array and proceed left to right, top to bottom fashion.

In embodiments, the method 550 further includes a step 580 of initiating a shape RLE group upon detecting a pixel cell that has been assigned a start value. The step 580 may also initiate a shape RLE group if the pixel cell has been assigned an "ON" state, and the previously scanned pixel 216 has been assigned an "OFF" state. For example, ON/OFF states may need to be toggled back and forth for shape RLE group initiation if the pixel 216 assigned the start value has been clipped, as discussed below. Initiating a shape RLE group may also include one or more steps of method 500.

In embodiments, the method 550 further includes a step 585 of extending the shape RLE group upon detection of a subsequently scanned adjacent pixel cell that is assigned an "ON" state. For example, the shape RLE group may be extended if the shape RLE group has been initiated and the pixel cell scanned is assigned an "ON" state. In this manner, all "ON" pixel cells contiguously extending from the start pixel 216 along the X-axis will be added to the shape RLE group.

In embodiments, the method 550 further includes a step 590 of terminating the shape RLE group upon the detection of the adjacent cell that is assigned an "OFF" state. For example, the shape RLE group may be terminated if the shape RLE group has been initiated, and the pixel cell scanned is assigned an "OFF" state.

In embodiments, the method further includes a step 595 of storing the position and length of the shape RLE group as a shape RLE vector. For example, the data corresponding to the position, length, and other aspects of the shape RLE group may be stored in memory 120. The one or more processors may also convert the shape RLE group as instructed into the RLE vector. The process may then reinitiate by further scanning along the first row of the first axis. Upon reaching the end of the array line, scanning may initiate along the second row of the first axis, and so on.

The conversion of filled shapes to RLE vectors may be extended to include clipping of filled shapes 204 to form a defined shape and limiting how the defined shape is displayed. Clipping assumes that the filled shape may be processed into an RLE form and may be converted to RLE vectors, and that the clipping region may also be processed into an RLE form and possibly converted to RLE vectors. By converting the filled shape 204 and clipping region 600 to similar data forms, the conversion of the filled shape 204 to a final clipped image is rapid and processively efficient.

Figure 6:
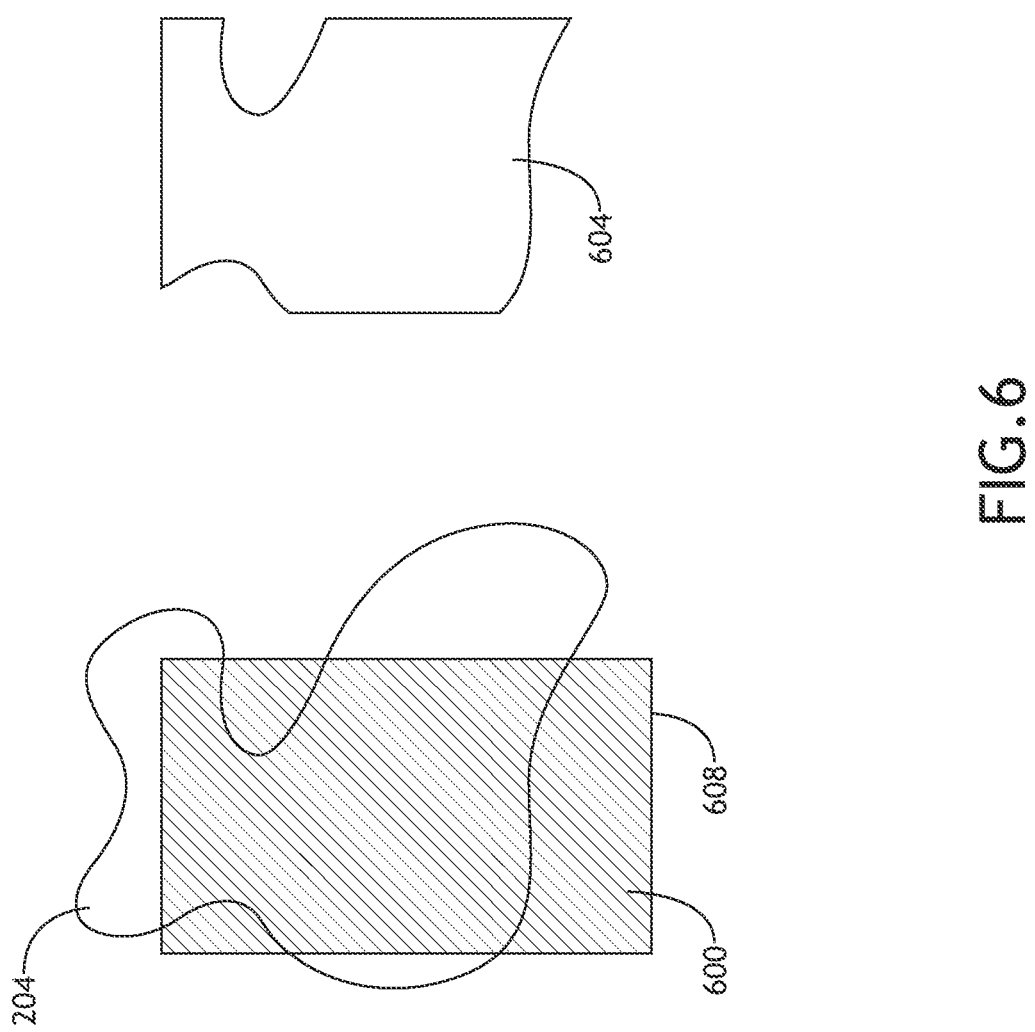
FIG. 6 is drawing illustrating a filled shape overlaid by a clipping region, and a clipped shape produced by the clipping of the filled shape to the dimension of the clipping region in accordance with one or more embodiments of the disclosure.

FIG. 6 is drawing illustrating a filled shape 204 overlaid by a clipping region 600, and a clipped shape 604 produced by the clipping of the filled shape 204 to the dimension of the clipping region 600 in accordance with one or more embodiments of the disclosure. The clipping region 600 may be of any shape of size, and in some instances may bound the filled shape 204 by placing an outer limiter on what can be visualized (e.g., a clipping boundary). In other instances, the clipping region 600 may bound the filled shape 204 by excluding a region, referred to as an exclusion boundary, exclusion clipping region, exclusion zone, or a cutout.

In embodiments, the scheme used to convert filled shapes 204 to RLE vectors may also be used as a base or template for creating a virtual clip array similar to the virtual pixel array 212. By matching the virtual clip array to the virtual pixel array 212, software within the system 102 may quickly process shapes with complex clip regions 600. For example, a clipping algorithm may include converting both the filled section 224 and a clipping region 600 to a combined array, an RLE vector, or a set of RLE vectors, and compare, left-to-right, across the data set to determine clipped shape 604. In this manner, the clipping may be performed with a complexity of a O(n) operation, considerably less complex, and less processor intensive that $O(n^2)$ clipping operations, particularly those based on Sutherland-Hodgman and Weiler-Atherton clipping methods.

Figure 7:
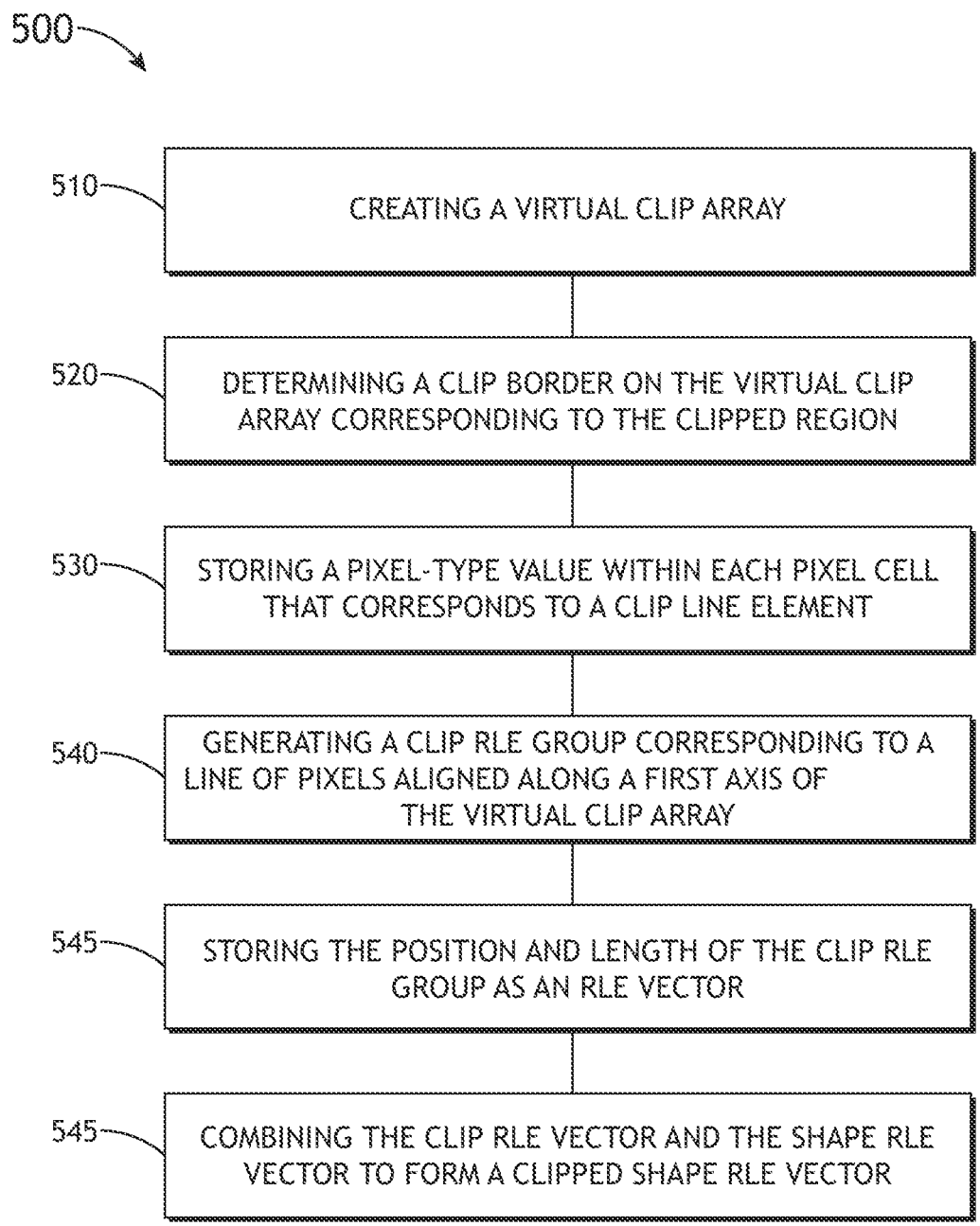
FIG. 7 is a method for clipping a filled shape, in accordance with one or more embodiments of the disclosure.

FIG. 7 is a method 700 for clipping a filled shape 204, in accordance with one or more embodiments of the disclosure. The method 700 may be utilized under any graphic conversion protocol. For example, the method 700 may be used to facilitate the clipping of RLE-filled areas during the conversion of aircraft charts (e.g., navigation charts or planning charts). The method 700 may extend, may be extended from, or may include one or more steps of methods 300, 500, 550.

In embodiments, the method 700 includes a step 710 of creating a virtual clip array. The virtual clip array is formed of pixel cells similar to the virtual pixel array 212. The virtual clip array must have dimensions as large as, or larger than the clipping region 600. For example, the virtual clip array may be equal to the size of the display area and/or the virtual pixel array 212.

In embodiments, the method 700 further includes a step 720 of determining a clip border 608 on the virtual clip array corresponding to the clipped region 600. For example, the clipping region 600 may define the specific dimensions and coordinates as required to clip the filled shape 204, which is defined by the clip border 608. As in the method 550, the clip border 608 comprises one or more clip lines, which further comprise one or more clip line elements, similar to the border lines 226 and border elements 222, respectively.

In embodiments, the method 700 includes a step 730 of storing a pixel-type value within each pixel cell that corresponds to a clip line element. The pixel-type values may be identical or analogous to the pixel-type values used in method 550 and described herein. For example, a clip line element may be assigned a start value, a line value, or a vertex value.

In embodiments, the method 700 further includes a step 740 of generating a clip RLE group corresponding to a line of pixels 216 aligned along a first axis of the virtual clip array. The clip RLE group may be formed similar to the shape RLE group. For example, the forming of the clip RLE group may include scanning of the virtual clip array along a first axis, initiating the clip RLE group upon detecting a pixel cell that has been assigned a start value, extending the clip RLE group upon detection of a subsequently scanned adjacent pixel cell determined within the clipped region and/or assigned an "OFF" state (e.g., as opposed to assigned an "ON" state in method 550), and/or terminating the clip RLE group upon the detection of the adjacent pixel cell that is outside the clipped region 600 or assigned an "ON" state (e.g., as opposed to assigned an "OFF" state in method 550).

In embodiments, the method 700 further includes a step 750 storing the position and length of the clip RLE group as an clip RLE vector. For example, data from the clip RLE group may be stored in memory 120 and processed as described herein.

In embodiments, the method 700 further includes a step 760 of combining the clip RLE vector and the shape RLE vector to form a clipped shape RLE vector (e.g., ultimately forming the clipped shape 604). The combining may include a series of logic steps to determine whether a pixel 216 should be "ON" or "OFF". For example, through a comparison of an exclusion clip RLE vector and a shape RLE vectors, a processor may determine that if the pixel 216 on the filled shape 204 is "ON" and an associated pixel 216 of the clipping region 600 is "OFF", then the pixel 216 is "OFF" (e.g., the clip RLE vector overriding the shape RLE vector).

The method 700 is efficient, and may have distinct advantages over other clipping methods. For example, the method 700 works with concave regions, which cannot be performed using the Sutherland-Hodgman method. In another example, the method 700 works more efficiently with complex clipping regions 600 (e.g., having hundreds of thousands of points) than using the Weiler-Atherton protocol. The method 700 is relatively simple to understand, code, and verify, as compared to industry standard methods.

Charts, such as avionic navigation charts, are often defined using a single clipping region 600 that affects multiple filled areas. Standard methods require each filled area 204 to interact with the clipping region 600 independently. Using the method 700, it is possible to process the clipping region 600 a single time and have data from the clipping region 600 interact with all filled areas 204 without traversing the clipping region 600 multiple times, decreasing the time required to process charts with these characteristics.

Figure 8A:
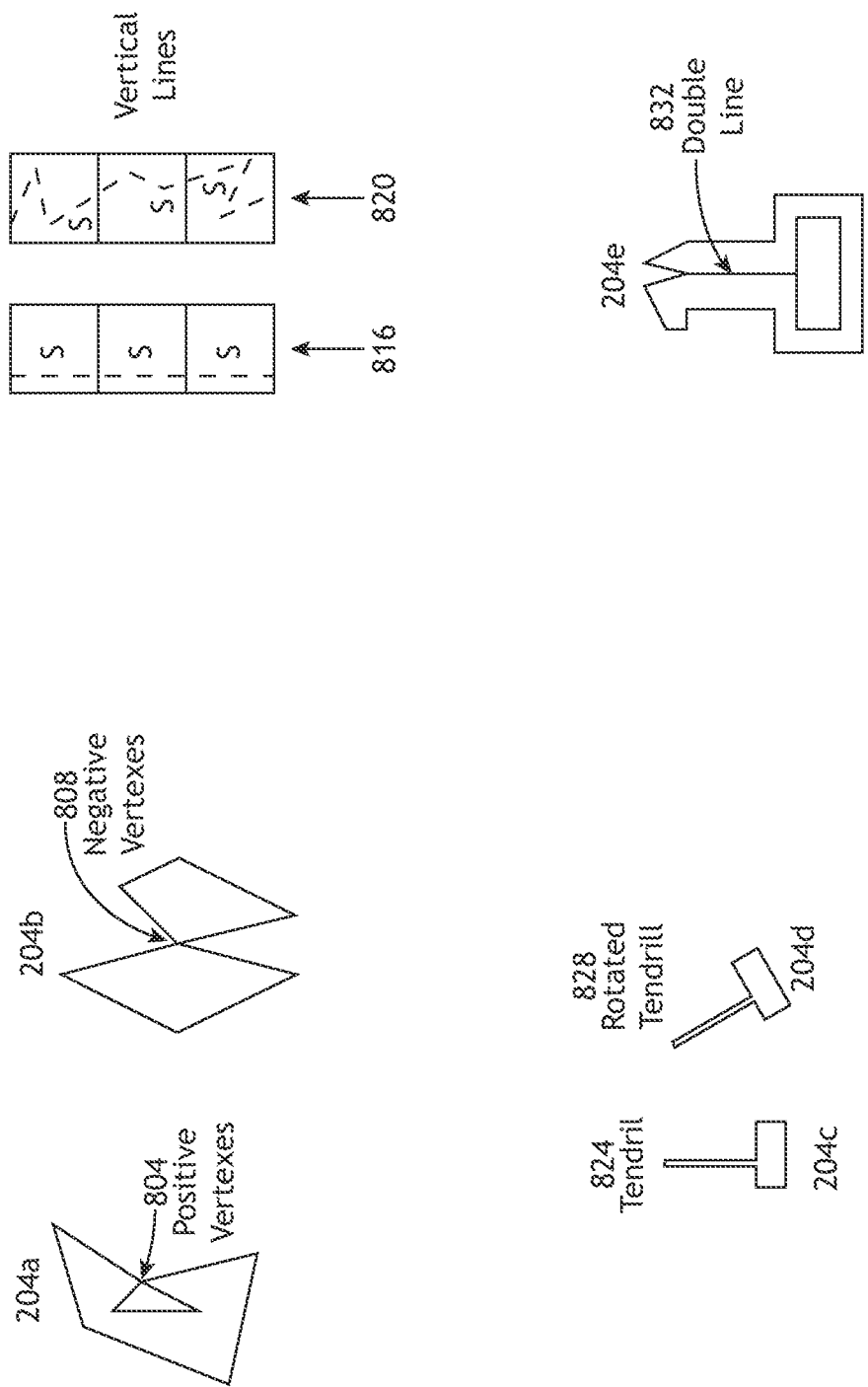
FIG. 8A-B are drawings illustrating lines and shapes that are defined and/or formed via the conversion of filled areas to RLE vectors, in accordance with one or more embodiments of the disclosure.
Figure 8B:
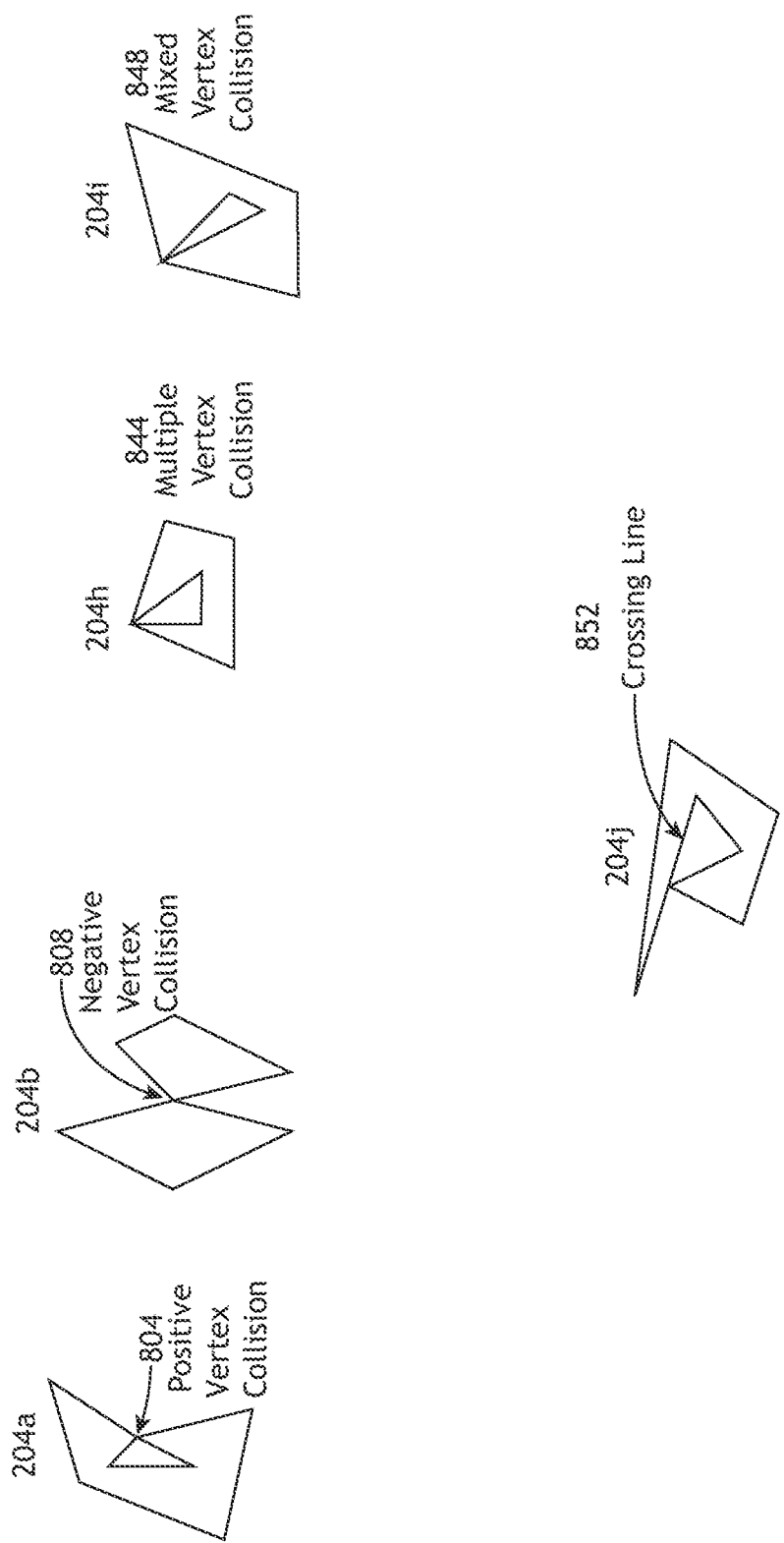

FIG. 8A-B are drawings illustrating lines and shapes that may be defined and/or formed via the conversion of filled areas to RLE vectors, in accordance with one or more embodiments of the disclosure. For example, some filled shapes 204a may include positive vertices 804 that are drawn, whereas some filled shapes 204b may negative vertices 808 that are created from spaces between extensions. In another example, vertical lines 816, 820 are lines that do not cross a Y-axis boundary. As in horizontal border lines 226, the vertical lines 816, 820 may be formed from aligned border elements (e.g., vertical line 816) or from non-aligned border elements (e.g., vertical line 820).

In another example, the filled shape 204c, 204d may include tendrils 824, 828, defined as pixel-wide lengths of filled area, may be formed. The tendrils may be aligned with an axis (e.g., tendril 824) or rotated (e.g., tendril 828). In another example, a filled shape 204e may include a double line 832 (e.g., a line that is filled on both sides, where lines are close together and share a pixel 216).

Referring to FIG. 8B, the filled shape 204f-l may contain collisions (e.g., positive vertex collisions 836, extension collisions 840, multiple vertex collisions 844, or mixed vertex collisions 848). Collisions occur whenever two or more lines share a pixel 216. For example, a double line is a collision. In another example, a filled shape 2041 may contain a crossing line 852, defined as a collision between a vertex and line. When a collision between a vertex and a line occurs during processing, the line takes precedence.

It is to be understood that embodiments of the methods disclosed herein may include one or more of the steps described herein. Further, such steps may be carried out in any desired order and two or more of the steps may be carried out simultaneously with one another. Two or more of the steps disclosed herein may be combined in a single step, and in some embodiments, one or more of the steps may be carried out as two or more sub-steps. Further, other steps or sub-steps may be carried in addition to, or as substitutes to one or more of the steps disclosed herein.

Although inventive concepts have been described with reference to the embodiments illustrated in the attached drawing figures, equivalents may be employed and substitutions made herein without departing from the scope of the claims. Components illustrated and described herein are merely examples of a system/device and components that may be used to implement embodiments of the inventive concepts and may be replaced with other devices and components without departing from the scope of the claims. Furthermore, any dimensions, degrees, and/or numerical ranges provided herein are to be understood as non-limiting examples unless otherwise specified in the claims.

What is claimed is:

1. A method for converting a filled shape to a run length encoded (RLE) vector comprising:
   creating a virtual pixel array of pixel cells corresponding to a graphical array of pixels by digitizing and converting a display area including the filled shape, wherein the graphical array includes a grid placed over the filled shape, wherein the filled shape is displayed on an avionics chart, wherein the virtual pixel array of pixel cells includes a mathematical construct corresponding to the graphical array of pixels, wherein a pixel cell corresponding to a pixel of the filled shape is assigned an "ON" state, wherein a pixel cell not corresponding to the pixel of the filled shape is assigned an "OFF" state;
   determining a border on the virtual pixel array corresponding to the filled shape, wherein the border comprises one or more border lines, wherein each border line comprises one or more border line elements, wherein each border line element corresponds to a single pixel;
   assigning a pixel-type value to each pixel cell that corresponds to a border line element of the filled shape within the pixel, wherein the pixel-type value includes at least one of a start value, a line value, or a vertex value;
   creating a shape RLE group corresponding to a line of pixels aligned along a first axis of the virtual pixel array comprising:
      scanning the virtual pixel array along a first row of the first axis;
      initiating the shape RLE group upon detecting a pixel cell that has been assigned the start value;
      extending the shape RLE group upon detection of a subsequently scanned adjacent pixel cell that is assigned the "ON" state; and
      terminating the shape RLE group upon the detection of the adjacent cell that is assigned the "OFF" state;
      storing a position and a length of the shape RLE group as a shape RLE vector by converting the shape RLE group into the shape RLE vector.

2. The method of claim 1, further comprising continuing the scanning of the virtual pixel array along the first axis of a graphical display to an end of the array line, wherein upon reaching the end of the array line, scanning initiates along a second row of the first axis relative to a position of a second axis.

3. The method of claim 2, wherein the first axis is configured as an X-axis, and the second axis is configured as a Y-axis.

4. The method of claim 3, wherein scanning is configured to proceed from left to right along the X-axis.

5. The method of claim 1, wherein the filled shape may be configured with an internal unfilled region.

6. The method of claim 1, wherein the avionics chart is configured as a digital flight management system chart.

7. The method of claim 1, further comprising clipping the filled shape, wherein clipping the filled shape comprises:
   creating a virtual clip array;
   determining a clip border on the virtual clip array corresponding to the clipped region;
   storing a pixel-type value within each pixel cell that corresponds to a clip line element;
   generating a clip RLE group corresponding to a line of pixels aligned along a first axis of the virtual clip array;
   storing a position and a length of the clip RLE group as a clip RLE vector; and
   combining the clip RLE vector and the shape RLE vector to form a clipped shape RLE vector.

8. The method of claim 7, wherein the clipped region bounds a visualized region of the filled shape.

9. The method of claim 7, wherein the clipped region bounds an exclusion zone of the filled shape.

10. The method of claim 9, wherein the method is configured with O(n) complexity to compute.

11. A system comprising:
   a controller configured to convert a filled shape to a run length encoded (RLE) vector comprising:
   one or more processors; and
   a memory configured to store data and instructions executable by the one or more processors, wherein the instructions include:
      creating a virtual pixel array of pixel cells corresponding to a graphical array of graphic pixels by digitizing and converting a display area including the filled shape, wherein the graphical array includes a grid placed over the filled shape, wherein the filled shape is displayed on an avionics chart, wherein the virtual pixel array of pixel cells includes a mathematical construct corresponding to the graphical array of pixels, wherein a pixel cell corresponding to a graphic pixel of the filled shape is assigned an "ON" state, wherein a pixel cell not corresponding to the graphical pixel of the filled shape is assigned an "OFF" state;
      determining a border on the virtual pixel array corresponding to the filled shape, wherein the border comprises one or more border lines, wherein each border line comprises one or more border line elements, wherein each border line element corresponds to a single pixel;
      assigning a pixel-type value to each pixel cell that corresponds to a border line element of the filled shape within the graphic pixel, wherein the pixel-type value includes at least one of a start value, a line value, or a vertex value;
      creating a shape RLE group corresponding to a line of pixels aligned along a first axis comprising:
         scanning the virtual pixel array along a first row of the first axis;
         initiating a shape RLE group upon detecting a pixel cell that has been assigned the start value;
         extending the shape RLE group upon detection of a subsequently scanned adjacent pixel cell that is assigned the "ON" state;

terminating the shape RLE group upon the detection of the adjacent cell that is assigned the "OFF" state; and storing the position and length of the shape RLE group as a shape RLE vector by converting the shape RLE group into the shape RLE vector.

12. The system of claim 10, wherein the avionics chart is configured as a digital flight management system chart.

13. The system of claim 11, wherein the instructions further include clipping the filled shape, wherein clipping the filled shape comprises:

creating a virtual clip array;

determining a clip border on the virtual clip array corresponding to the clipped region;

storing a pixel-type value within each pixel cell that corresponds to a clip line element;

generating a clip RLE group corresponding to a line of pixels aligned along a first axis of the virtual clip array;

storing a position and a length of the clip RLE group as a clip RLE vector; and combining the clip RLE vector and the shape RLE vector to form a clipped shape RLE vector.

\* \* \* \* \*